(12) United States Patent  
Saito

(10) Patent No.: US 7,349,247 B2  
(45) Date of Patent: Mar. 25, 2008

(54) MULTI-LAYER MAGNETIC SWITCHING ELEMENT COMPRISING A MAGNETIC SEMICONDUCTOR LAYER HAVING MAGNETIZATION INDUCED BY APPLIED VOLTAGE

(75) Inventor: Yoshiaki Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 226 days.

(21) Appl. No.: 10/918,396

(22) Filed: Aug. 16, 2004

(65) Prior Publication Data

US 2005/0012129 A1    Jan. 20, 2005

Related U.S. Application Data

(62) Division of application No. 10/329,535, filed on Dec. 27, 2002, now Pat. No. 6,807,091.

(30) Foreign Application Priority Data

Dec. 27, 2001    (JP)    ............... 2001-397386

(51) Int. Cl.
    *G11C 11/15* (2006.01)
(52) U.S. Cl. .................. 365/173; 365/171; 257/425
(58) Field of Classification Search ................ 365/158, 365/173 O, 171 X, 174, 173, 171; 257/425 X, 257/613, 425
    See application file for complete search history.

(56) References Cited

U.S. PATENT DOCUMENTS 5,640,343 A * 6/1997 Gallagher et al. .......... 365/171
6,178,112 B1 * 1/2001 Bessho et al. .............. 365/173
6,480,412 B1 * 11/2002 Bessho et al. .............. 365/173
6,878,979 B2 * 4/2005 Matsukawa et al. ........ 257/295
2003/0235072 A1    12/2003 Kim et al.

FOREIGN PATENT DOCUMENTS

| CN | 1148710 A | 4/1997 |
|---|---|---|
| CN | 1236995 A | 12/1999 |
| CN | 1244017 A | 2/2000 |
| CN | 1308317 A | 8/2001 |
| JP | 2003-92440 | 3/2003 |

OTHER PUBLICATIONS

H. Ohno, et al., Letters to Nature, vol. 408, pp. 944-946, "Electric-Field Control of Ferromagnetism"., Dec. 21-28, 2000.
Patent Abstracts of Japan (11-330387, 11-330585, and 2000-082283) corresponds to CN1236995A.
Patent Abstracts of Japan (09-147326) corresponds to CN1148710A.
Patent Abstracts of Japan (2001-156357 and 2001-156358) corresponds to CN1308317A.
Patent Abstracts of Japan (2000-082791) corresponds to CN1244017A.

* cited by examiner

*Primary Examiner*—VanThu Nguyen
(74) *Attorney, Agent, or Firm*—Oblon, Spivak, McClelland, Maier & Neustadt, P.C.

(57) ABSTRACT

A magnetic switching element includes: a ferromagnetic layer which is substantially pinned in magnetization in one direction; and a magnetic semiconductor layer provided within a range where a magnetic field from the ferromagnetic layer reaches, where the magnetic semiconductor layer changes its state from a paramagnetic state to a ferromagnetic state by applying a voltage thereto, and a magnetization corresponding to the magnetization of the ferromagnetic layer is induced in the magnetic semiconductor layer by applying a voltage to the magnetic semiconductor layer.

7 Claims, 18 Drawing Sheets

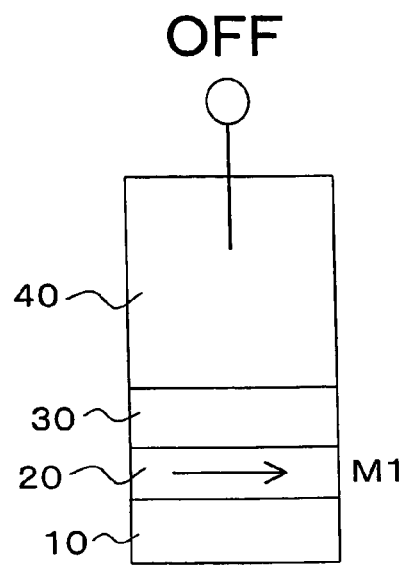
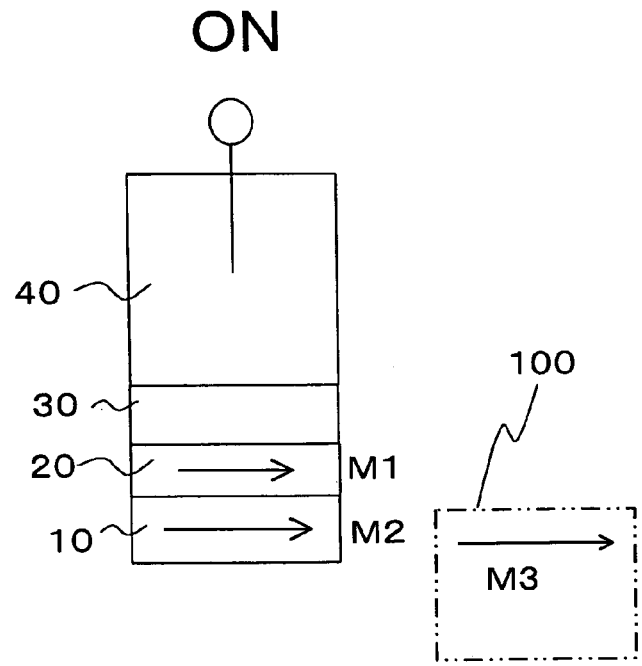
FIG.1A  FIG.1B
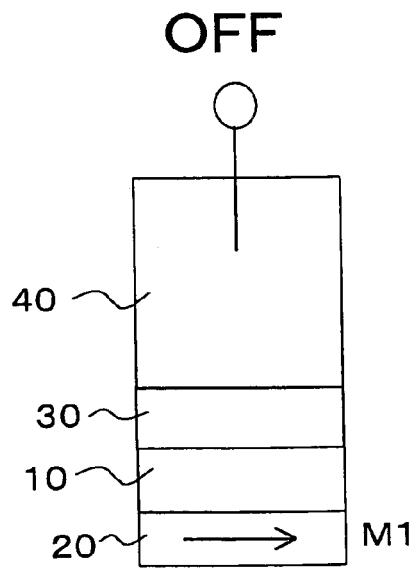
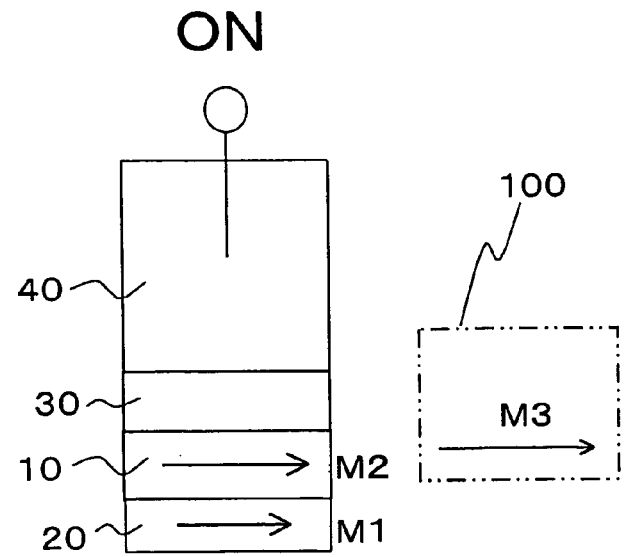
FIG.2A  FIG.2B

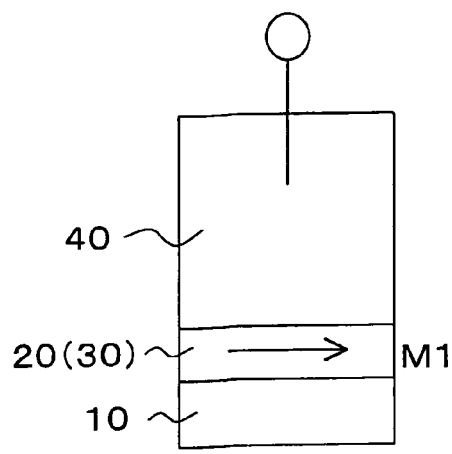
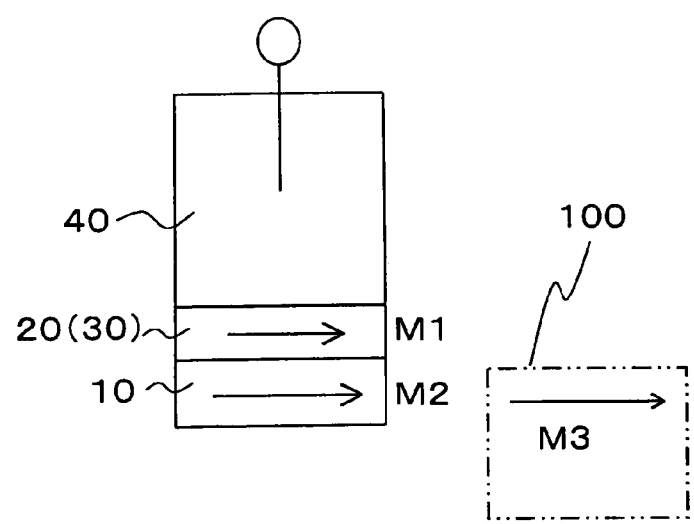
FIG.3A    FIG.3B
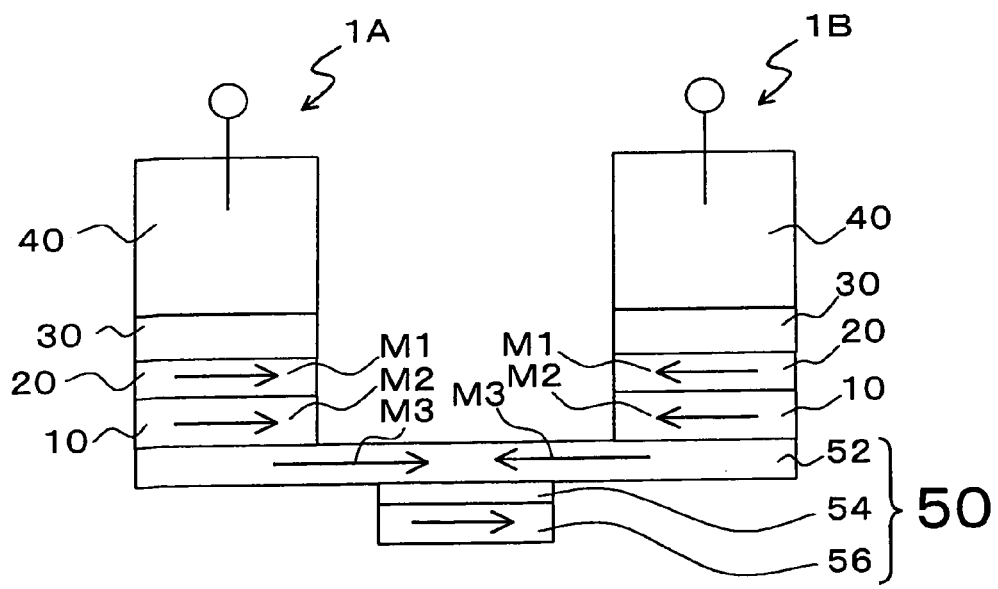
FIG.4

MULTI-LAYER MAGNETIC SWITCHING ELEMENT COMPRISING A MAGNETIC SEMICONDUCTOR LAYER HAVING MAGNETIZATION INDUCED BY APPLIED VOLTAGE

CROSS-REFERENCE TO RELATED APPLICATIONS

This application is based upon and claims the benefit of priority from the prior Japanese Patent Application No. 2001-397386, filed on Dec. 27, 2001; the entire contents of which are incorporated herein by reference.

BACKGROUND OF THE INVENTION

This invention relates to a magnetic switching element the and a magnetic memory, and more particularly, to the magnetic switching element which can generate magnetization in much lower power consumption than before by controlling a magnetization direction induced in a magnetic semiconductor, and the magnetic memory using the switching element.

Magnetoresistance effect element using a magnetic film is used for the magnetic head, the magnetic sensor, for example, and there is a proposal to use the magnetoresistance effect elements in a solid-state magnetic memory (magnetoresistance effect memory or MRAM (Magnetic Random Access Memory)).

Recently, a so called "tunneling magnetoresistance effect element (TMR element) has been proposed as a magnetoresistance effect element configured to flow a current perpendicularly to the film plane in a sandwich-structured film interposing a single dielectric layer between two magnetic metal layers and to use the tunneling current.

Since tunneling magnetoresistance effect elements have been improved to ensure 20% or higher ratio of change in magnetoresistance (J. Appl. Phys. 79, 4724 (1996)), the possibility of civilian applications of MRAM is increasing.

A tunneling magnetoresistance effect element can be obtained by first forming a thin Al (aluminum) layer, 0.6 nm through 2.0 nm thick, on a ferromagnetic electrode, and thereafter exposing its surface to a glow discharge of oxygen or oxygen gas to form a tunnel barrier layer of $Al_2O_3$.

There is also proposed a ferromagnetic single tunneling junction structure in which an anti-ferromagnetic layer is provided in one of the ferromagnetic layers on one side of the single ferromagnetic tunneling junction and the other ferromagnetic layer is used as a magnetically pinned layer (Japanese Patent Laid-Open Publication No. H10-4227).

Other type ferromagnetic tunneling junction structures, namely, one having a ferromagnetic tunneling junction via magnetic particles distributed in a dielectric material and one having double ferromagnetic tunneling junctions (continuous film) have been proposed as well (Phys. Rev. B56 (10), R5747 (1997), J. The Magnetics Society of Japan 23, 4-2, (1999), Appl. Phys. Lett. 73(19), 2829 (1998), Jpn. J. Appl. Phys. 39, L1035(2001)).

Also these ferromagnetic tunneling junctions have been improved to ensure a ratio of magnetoresistance change from 20 to 50% and to prevent a decrease of the ratio of magnetoresistance change even upon an increase of the voltage value applied to tunneling magnetoresistance effect elements to obtain a desired output voltage, and there is the possibility of their applications to MRAM.

Magnetic recording elements using such a singe ferromagnetic tunneling junction or double ferromagnetic tunneling junctions are nonvolatile and have high potentials such as high write and read speed not slower than 10 nanoseconds and programmable frequency not less than 1015 times.

Especially, ferromagnetic double-tunneling structures ensure large output voltages and exhibit favorable properties as magnetic recording elements because the ratio of magnetoresistance change does not decrease even upon an increase of the voltage value applied to tunneling magnetoresistance effect elements to obtain a desired output voltage value as mentioned above.

With regard to the memory cell size, however, those existing techniques involve the problem that the size cannot be decreased below semiconductor DRAM (dynamic random access memory) when a 1 Tr (transistor) −1 TMR architecture (disclosed, for example, in U.S. Pat. No. 5,734,605) is employed.

In order to overcome the problem, there are proposals such as a diode-type architecture in which TMR cells and diodes are serially connected between bit lines and word lines (U.S. Pat. No. 5,640,343), and a simple-matrix architecture in which TMR cells are placed between bit lines and word lines (DE 19744095, WO 9914760).

However, in any case, at the time of writing to a record layer, magnetization reversal is performed by applying a current magnetic field generated by a current pulse.

For this reason, the power consumption of a memory is large, when integrated, and there is a problem that a large scale memory cannot be carried out since there is a current density limit of wiring. If an absolute value of writing current is larger than 1 mA, area of a driver for passing the current will become larger.

For this reason, there is a problem that chip size becomes large, in comparison with non-volatile solid memories (for example, FeRAM (ferroelectric random-access memory), FLASH(flash memory), etc.) of other types of memories.

SUMMARY OF THE INVENTION

As mentioned above, in order to realize a super-large scale magnetic memory, an architecture with little power consumption and the new method of writing are needed.

Moreover, the same demand exists in all the applications that need to switch a magnetic field. For example, also in a magnetic recording head, a magnetic drive type actuator, etc., if it becomes possible to switch a magnetic field, without using a current magnetic field, a greatly improved performance will be obtained. Moreover, various kinds of new magnetic application equipments can be realized.

According to an embodiment of the invention, there is provided a magnetic switching element comprising:

a ferromagnetic layer which is substantially pinned in magnetization in one direction; and a magnetic semiconductor layer provided within a range where a magnetic field from the ferromagnetic layer reaches, the magnetic semiconductor layer changing its state from a paramagnetic state to a ferromagnetic state by applying a voltage thereto, a magnetization corresponding to the magnetization of the ferromagnetic layer being induced in the magnetic semiconductor layer by applying a voltage to the magnetic semiconductor layer.

In the specification, the term "a range where a magnetic field reaches" means a range where a magnetic interaction exist between a magnetic semiconductor layer and a ferromagnetic layer. As long as such a magnetic interaction exists, the term includes a case where the magnetic semiconductor layer and the ferromagnetic layer are provided adjacently, a case where these layers are apart, and a case where another layer such as a non-magnetic layer is interposed therebetween.

According to another embodiment of the invention, there is provided a magnetic switching element comprising a gate electrode;

a magnetic semiconductor layer which changes its state from a paramagnetic state to a ferromagnetic state by applying a voltage thereto; and a ferromagnetic layer provided between the gate electrode and the magnetic semiconductor layer or provided on a opposite side of the magnetic semiconductor layer from the gate electrode, the ferromagnetic layer being substantially pinned in magnetization in one direction, a magnetization corresponding to the magnetization of the ferromagnetic layer being induced in the magnetic semiconductor layer by applying a voltage to the magnetic semiconductor layer through the gate electrode.

According to yet another embodiment of the invention, there is provided a magnetic memory comprising a memory cell having:

a first magnetic switching element including:

a first ferromagnetic layer which is substantially pinned in magnetization in a first direction; and a first magnetic semiconductor layer provided within a range where a magnetic field from the first ferromagnetic layer reaches, the first magnetic semiconductor layer changing its state from a paramagnetic state to a ferromagnetic state by applying a voltage thereto, a magnetization corresponding to the magnetization of the first ferromagnetic layer being induced in the first magnetic semiconductor layer by applying a voltage to the first magnetic semiconductor layer;

a second magnetic switching element including:

a second ferromagnetic layer which is substantially pinned in magnetization in a second direction; and a second magnetic semiconductor layer provided within a range where a magnetic field from the second ferromagnetic layer reaches, the second magnetic semiconductor layer changing its state from a paramagnetic state to a ferromagnetic state by applying a voltage thereto, a magnetization corresponding to the magnetization of the second ferromagnetic layer being induced in the second magnetic semiconductor layer by applying a voltage to the second magnetic semiconductor layer; and a magnetoresistance effect element including a record layer made of a ferromagnetic material, a magnetization corresponding to the magnetization of the first magnetic semiconductor layer being recorded in the record layer when the magnetization is induced in the first magnetic semiconductor layer of the first mimetic switching element, and a magnetization corresponding to the magnetization of the second magnetic semiconductor layer being recorded in the record layer when the magnetization is induced in the second magnetic semiconductor layer of the second magnetic switching element.

According to yet another embodiment of the invention, there is provided a magnetic memory comprising a memory cell having:

a first magnetic switching element including:

a first gate electrode;

a first magnetic semiconductor layer which changes its state from a paramagnetic state to a ferromagnetic state by applying a voltage thereto; and a first ferromagnetic layer provided between the first gate electrode and the first magnetic semiconductor layer or provided on a opposite side of the first magnetic semiconductor layer from the first gate electrode, the first ferromagnetic layer being substantially pinned in magnetization in a first iron, a magnetization corresponding to the magnetization of the first ferromagnetic layer being induced in the first magnetic semiconductor layer by applying a voltage to the first magnetic semiconductor layer through the first gate electrode;

a second magnetic switching element including:

a second gate electrode;

a second magnetic semiconductor layer which changes its state from a paramagnetic state to a ferromagnetic state by applying a voltage thereto; and a second ferromagnetic layer provided between the second gate electrode and the second magnetic semiconductor layer or provided on a opposite side of the second magnetic semiconductor layer from the second gate electrode, the second ferromagnetic layer being substantially pinned in magnetization in a second diction, a magnetization corresponding to the magnetization of the second ferromagnetic layer being induced in the second magnetic semiconductor layer by applying a voltage to the second magnetic semiconductor layer through the second gate electrode; and a magnetoresistance effect element including a record layer made of a ferromagnetic material, a magnetization corresponding to the magnetization of the first magnetic semiconductor layer being recorded in the record layer when the magnetization is induced in the first magnetic semiconductor layer of the first magnetic switching element, and a magnetization corresponding to the magnetization of the second magnetic semiconductor layer being recorded in the record layer when the magnetization is induced in the second magnetic semiconductor layer of the second magnetic switching element.

According to yet another embodiment of the invention, there is provided a magnetic memory comprising a plurality of memory cells in a matrix arrangement, each one of the memory cells having:

a first magnetic switching element including:

a first ferromagnetic layer which is substantially pinned in magnetization in a first direction; and a first magnetic semiconductor layer provided within a range where a magnetic field from the first ferromagnetic layer reaches, the first magnetic semiconductor layer changing its state from a paramagnetic state to a ferromagnetic state by applying a voltage thereto, a magnetization corresponding to the magnetization of the first ferromagnetic layer being induced in the first magnetic semiconductor layer by applying a voltage to the first magnetic semiconductor layer; a second magnetic switching element including:

a second ferromagnetic layer which is substantially pinned in magnetization in a second direction; and a second magnetic semiconductor layer provided within a range where a magnetic field from the second ferromagnetic layer reaches, the second magnetic semiconductor layer changing its state from a paramagnetic state to a ferromagnetic state by applying a voltage thereto, a magnetization corresponding to the monetization of the second ferromagnetic layer being induced in the second magnetic semiconductor layer by applying a voltage to the second magnetic semiconductor layer; and a magnetoresistance effect element including a record layer made of a ferromagnetic material, a magnetization corresponding to the magnetization of the first magnetic semiconductor layer being recorded in the record layer when the magnetization is induced in the first magnetic semiconductor layer of the first magnetic switching element, and a magnetization corresponding to the magnetization of the second magnetic semiconductor layer being recorded in the record layer when the magnetization is induced in the second magnetic semiconductor layer of the second magnetic switching element, binary information being recorded as the magnetization in the record layer of the magnetoresistance effect element of a predetermined one of the memory cells by selecting the memory cell and by applying the voltage to either one of the first and second magnetic semiconductor layers.

According to the invention, it becomes possible to obtain predetermined magnetization by application of voltage, the magnetic switching element of super-power consumption, a magnetic memory or a magnetic probe, a magnetic head, etc. can be realized, and the merit on industry is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIGS. 1A and 1B are conceptual diagrams for explaining the principal part and its operation of a magnetic switching element according to an embodiment of the invention;

FIGS. 2A and 2B shows the structure where the stacking order of the magnetic semiconductor layer 10 and the ferromagnetic layer 20 is reversed;

FIGS. 3A and 3B are conceptual diagrams of a magnetic switching element according to an embodiment of the invention where the gate insulation film and the ferromagnetic layer are unified;

FIG. 4 is a conceptual diagram for explaining the writing principle of the unit cell of the magnetic memory according to an embodiment of the invention;

DETAILED DESCRIPTION

Figure 5:
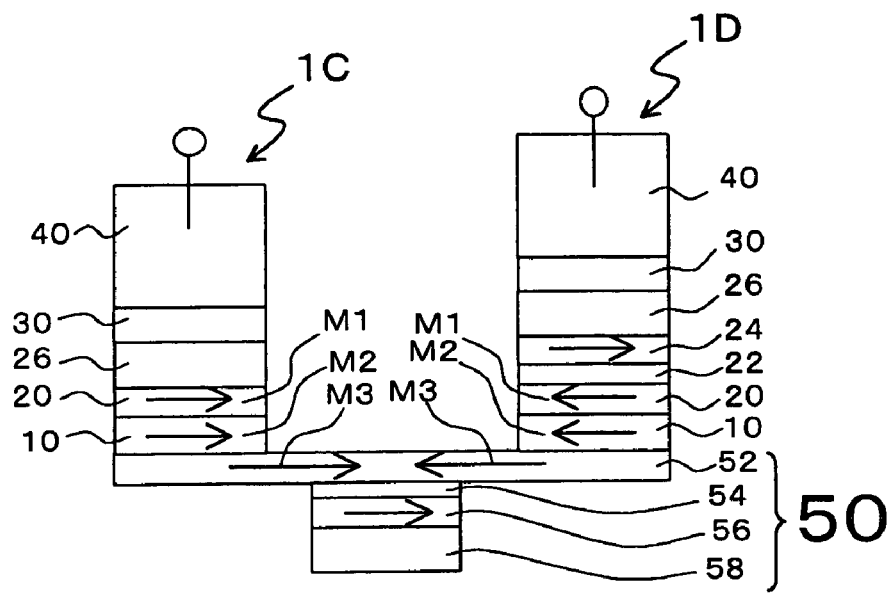
FIG. 5 is a conceptual diagram for explaining the writing principle of the unit cell of the magnetic memory according to an embodiment of the invention.

Some embodiments of the invention will now be explained below with reference to the drawings.

FIGS. 1A and 1B are conceptual diagrams for explaining the principal part and its operation of a magnetic switching element according to an embodiment of the invention.

As expressed in these diagrams, the magnetic switching element of the embodiment has the structure where the magnetic semiconductor layer 10, the ferromagnetic layer 20, the gate insulation film 30, and the gate electrode 40 are stacked.

The magnetic semiconductor layer 10 has a magnetic character and a semiconducting character as well, and consists of a material in which these two characters have a strong correlation therebetween. Specifically, as the material of the magnetic semiconductor layer 10, such as III–V group compound semiconductors and II–VI group compound semiconductors in which magnetic elements such as manganese (Mn) and chromium (Cr) are added can be used.

Such a magnetic semiconductor shows a paramagnetic property in the state where voltage is not applied. This is because the concentrations of the magnetic elements, such as manganese (Mn) and chromium (Cr) are low enough to make the interaction between these magnetic elements become slight.

On the other hand, a ferromagnetism is induced when a voltage is applied to the magnetic semiconductor (Nature 408, 944. (2000)). It is considered that by applying a voltage, the concentration of electrons or holes is changed and the interaction between the added magnetic elements such as manganese and chromium becomes remarkable. As a material of the magnetic semiconductor layer 10, wide gap semiconductors such as (In, Mn)As, (Ga, Mn)As, (Zn, Mn)Te, GaN, ZnO, and $TiO_2$ which are doped with transition metal elements can be used. $(Cd_{1-x}Mn_x)GeP_2$, CrAs, (Ga, Cr)As, etc. can be also used for the magnetic semiconductor layer 10.

According to a kind of transition metal doped to the wide gap semiconductor, and concentration thereof, the magnetic semiconductor can realize various magnetic states, such as anti-ferromagnetism, paramagnetizm, and ferromagnetism.

Therefore, a ferromagnetism can be successfully induced in the magnetic semiconductor layer 10 of the embodiment by adding a suitable element.

For example, by applying voltage to (InMn)As dilute magnetic semiconductor, the number of holes in the (InMn)As layer can be controlled, and ferromagnetism can be induced by generating the interaction between the manganese (Mn) spins.

In the embodiment of the invention, as expressed in FIG. 1, a voltage can be applied with the gate electrode 40 through the gate insulation film 30.

According to this structure, since current does not flow in the switching element, power consumption can be greatly reduced compared with the elements which generates the conventional current magnetic field.

However, it is not possible to control the direction of the magnetization in the magnetic semiconductor layer 10 only by having applied the voltage thereto.

In the embodiment, the ferromagnetic magnetization direction of the magnetic semiconductor layer 10 is controlled by providing the ferromagnetic layer 20 adjacent.

That is, as expressed in FIGS. 1A and 1B, in a magnetic switching element of the embodiment, a ferromagnetic layer 20 which has magnetization M1 is provided to adjoin the magnetic semiconductor layer 10.

In this structure, when a voltage is applied to the gate electrode 40, the voltage is applied to the magnetic semiconductor layer 10 through the gate insulation film 30, and ferromagnetism is induced in the layer 10.

The magnetization M2 produced in the layer 10 is formed in the same direction as the magnetization M1 of the adjoining ferromagnetic layer 20.

Thus, the magnetization M2 of a predetermined direction can be induced in the magnetic semiconductor layer 10, and this magnetic field can be made to act on the object 100 for an action.

Here, the object 100 for an action may be a record layer of a magnetic memory, a magnetic recording medium or a subject in the case where the magnetization M2 is used as a magnetic probe.

It must be noted that the object 100 for an action should be provided in the range which the magnetization M2 induced by the magnetic semiconductor layer 10 reaches. Therefore, the object 100 may be provided near the undersurface of the magnetic semiconductor layer 10 instead of arranging the object 100 near the side edge thereof.

Thus, according to the embodiment, by applying voltage to the gate electrode 40, magnetization of the predetermined direction can be induced in the magnetic semiconductor layer 10, and the switching element which can control on and off of its magnetization with very low power consumption can be realized.

It should be noted that FIGS. 1A and 1B merely express the fundamental concept of the switching element of the embodiment. Skilled person can add various modification about each part of the element. For example, as explained in full details below, various kinds of modification such as reversing the magnetization direction by inserting a lamination of an anti-ferromagnetic layer and a ferromagnetic layer between the ferromagnetic layer 20 and the gate insulation film 30, and interposing a non-magnetic layer are possible.

Moreover, it is not limited to FIGS. 1A and 1B about a stacking order of each layer.

For example, as illustrated in FIGS. 2 and 2B, the stacking order of a magnetic semiconductor layer 10 and a ferromagnetic layer 20 may be reversed. Also in this case, by applying a voltage to the magnetic semiconductor layer 10 through the gate insulation film 30, ferromagnetism is induced in The layer 10 and that magnetization M2 is formed along the direction of the magnetization M1 of the adjoining ferromagnetic layer 20.

Thus, the magnetization M2 is switchable to the object 100 for an action provided near the magnetic semiconductor layer 10. Furthermore, in FIGS. 1A and 1B, it is also possible to unify the gate insulation film 30 ad the ferromagnetic layer 20.

FIGS. 3A and 3B are conceptual diagrams showing the magnetic switching element where the gate insulation film and the ferromagnetic layer are unified.

That is, if the material which is electrically insulative and has ferromagnetism is used, the ferromagnetic layer 20 and the gate insulation film 30 can be unified and formed as a single common layer. As such a material, a magnetic material of iron oxide systems, such as a ferrite, etc. can be mentioned, for example.

Hereafter, the magnetic memory using the magnetic switching element of the embodiment of the invention is explained first as an example of the application of the magnetic switching element of the invention.

FIGS. 4 through 7 are conceptual diagrams for explaining the writing principle of the unit cell of the magnetic memory of the embodiment of the invention.

First, the structures expressed in FIGS. 4 and 5 are of a first type according to an embodiment of the invention, where the switching element of the embodiment is arranged to touch directly with the record layer of a memory record element. That is, the switching elements 1A and 1B of the embodiment are formed in the both sides of the ferromagnetic layer 52. And the magnetoresistance effect element 50 is formed near the center of the ferromagnetic layer 52.

The magnetoresistance effect element includes a lamination of the insulating tunnel barrier 54 and the ferromagnetic insulating layer 56. That is, the ferromagnetic layer 52 acts as a record layer (free layer), and the ferromagnetic layer 56 acts as a magnetization pinned layer (pinned layer). Now, in a pair of magnetic switching elements 1A and 1B, each ferromagnetic layers 20 has the magnetization M1 of the opposite direction. Therefore, when a voltage is applied to the gate electrode 40, direction of the magnetization M2 produced in these magnetic semiconductor layers 10 and 10 also turns into opposite according to the magnetization direction of these ferromagnetism layers 20 and 20.

That is, by applying a voltage to either one of the switching elements 1A and 1B, the direction of the writing magnetization M3 of ferromagnetic layer 52 which is a record layer of the TMR element 50 can be chosen, and the writing of binary information is attained.

According to the embodiment, since a magnetic field is generated without passing current as mentioned above with reference to FIGS. 1A and 1B, power consumption can be greatly reduced.

Here, as a magnetoresistance effect element 50, a ferromagnetic tunnel junction which includes at least ferromagnetic layers 52 and 56 and at least one tunnel barrier insulation layer 54 can be used. If ferromagnetic tunnel junction is used, a signal output can be controllable by changing spin polarization ratio of a magnetic layer and also it is advantageous at the point that junction resistance is controllable by changing the thickness and the barrier height of a tunnel barrier insulation layer.

In these magnetoresistance effect elements 50, it is desirable to approach the ferromagnetic layer (pinned layer) 56 and to form the anti-ferromagnetic layer 58. It is because the magnetization direction of the pinned layer 56 can certainly be fed by the anti-ferromagnetism layer 58. Thus, the junction resistance changes depending upon the relationship between the direction of the magnetization spin of the pinned layer 56 and the direction of the magnetization spin of the record layer 52. Therefore, the spin information on the record layer 52 can be easily read out by detecting a signal output.

In order to write by the switching element of the embodiment of the invention, it is desirable that the ferromagnetic record layer 52 of the magnetoresistance effect element 50 has an uniaxial anisotropy. It is because the direction of a writing magnetization spin can be stabilized. Next, in the case of the example expressed in FIG. 5, switching element 1C has the same composition as what was expressed in FIG. 4, but switching element 1D has the structure where the laminating of the ferromagnetic layer 20, the non-magnetic layer 22, the ferromagnetic layer 24, and the anti-ferromagnetic layer 26 is carried out in this order from the magnetic semiconductor layer 10.

By combining these non-magnetic layer 22 through the anti-ferromagnetic layer 26, the direction of the magnetization M1 of the ferromagnetic layer 20 which controls the magnetization direction of the magnetic semiconductor layer 10 can be reversed with respect to the switching element 1C. Therefore, when the magnetization pinned process over a ferromagnetic layer is taken into consideration, the advantage that manufacture becomes easy is acquired.

Figure 6:
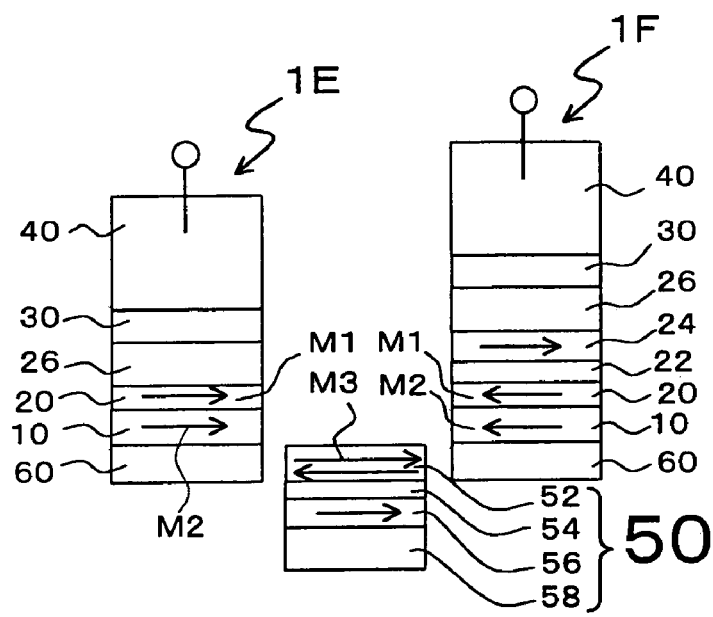
FIG. 6 is a conceptual diagram for explaining the writing principle of the unit cell of the magnetic memory according to an embodiment of the invention.
Figure 7:
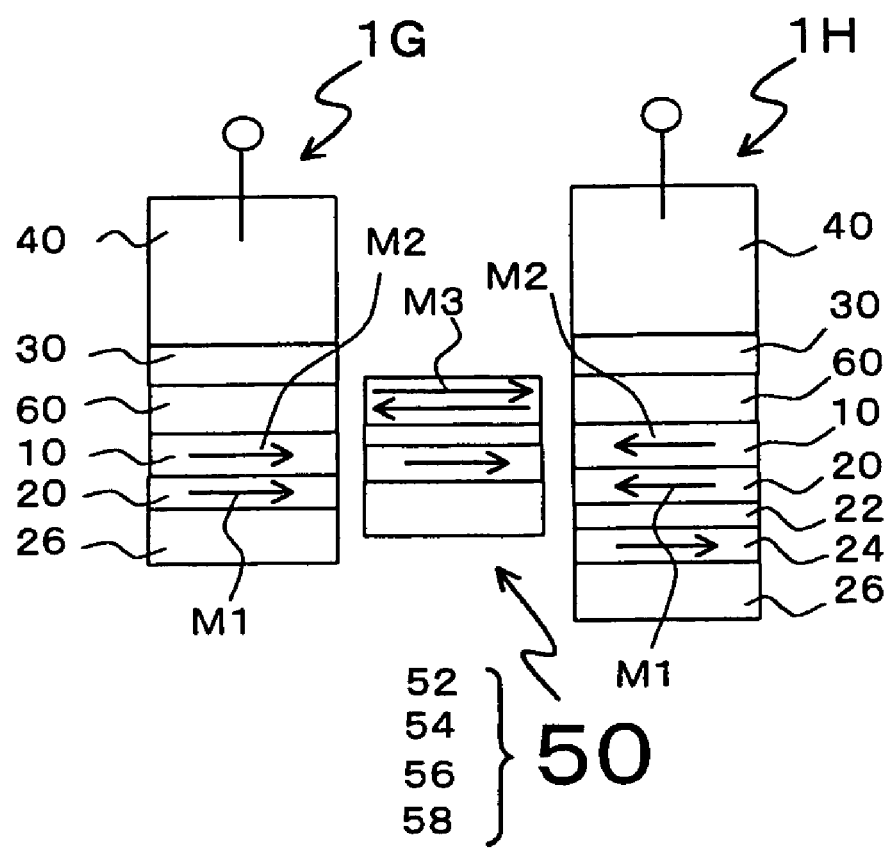
FIG. 7 is a conceptual diagram for explaining the writing principle of the unit cell of the magnetic memory according to an embodiment of the invention.

On the other hand, the structures expressed in FIGS. 6 and 7 are of the second type of the embodiment of the invention, where the switching elements 1E–1H have the ferromagnetic layer 60 for applying a magnetic field to the record layer 52 of the magnetoresistance effect element 50.

In the case of the memory element with which it expressed in FIG. 6, the principal part of switching element LE has the same layered structure as the switching elements 1A and 1C with which it expressed in FIGS. 4 and 5.

The principal part of switching element IF has the same layered structure as the switching element 1D. Therefore, either of the magnetization M2 of the opposite direction can be formed in each magnetic semiconductor layer 10 by applying a voltage to either of these switching elements 1E and 1F. By making this magnetization act on the record layer 52 of a TMR element through the ferromagnetic layer 60, binary information can be written freely.

In the case of the memory element with which it expressed in FIG. 7, the ferromagnetic layer 60 for bias application is formed between the magnetic semiconductor layer 10 and the gate insulation film 30. Also in this case, the magnetic semiconductor layer 10 forms magnetization M2 in the direction according to the magnetization M1 of the ferromagnetic layer 20 by application of a voltage, and magnetization is formed in the ferromagnetic layer 60 of this magnetization M2. By this magnetization in the ferromagnetic layer 60, binary information can be freely written in the record layer 52.

In the structure illustrated in FIG. 7, it is also possible to unify the gate insulation film 30 and the ferromagnetic layer 60 for bias application. That is, if the material which is electrically insulative and has ferromagnetism is used, these two layers can be unified and formed as a single common layer. As such a maternal, a magnetic material of iron oxide systems, such as a ferrite, etc. can be mentioned, for example.

As mentioned above, as illustrated in FIGS. 4 through 7, according to the embodiment of the invention, magnetic spin reversal is enabled not with a current magnetic field but with voltage by mug the magnetic field from the switching elements 1A–1H of the invention act on the memory record layer 52.

As the result, the magnetic memory which greatly reduced power consumption can be realized.

In the examples expressed in FIGS. 4 through 7 the ferromagnetic tunnel junction TMR (ferromagnetism single tunnel junction) is formed as a magnetoresistance effect element which is a memory record element.

However, the invention is not restricted to this specific example and it can also use the storage cell of other structures which include a record layer that is a switchable ferromagnetic layer.

FIGS. 8A through 8D are conceptual diagrams explaining the writing in the memory element of the first type illustrated in FIG. 5. That is, in the case of the memory element illustrated in these diagrams, the bit line BL1 wired in parallel to space is connected to the magnetization pined layer 56 of the TMR element 50, and the bit line BL2 perpendicularly wired to space is connected to it at the record layer 52.

Figure 8A:
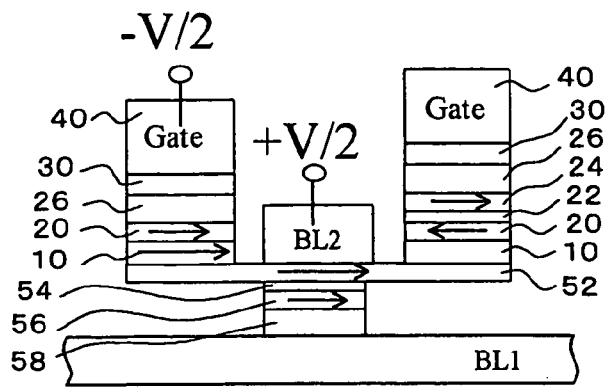
FIGS. 8A through 8D are conceptual diagrams for explaining the writing in the memory element of the first type illustrated in FIG. 5.
Figure 8B:
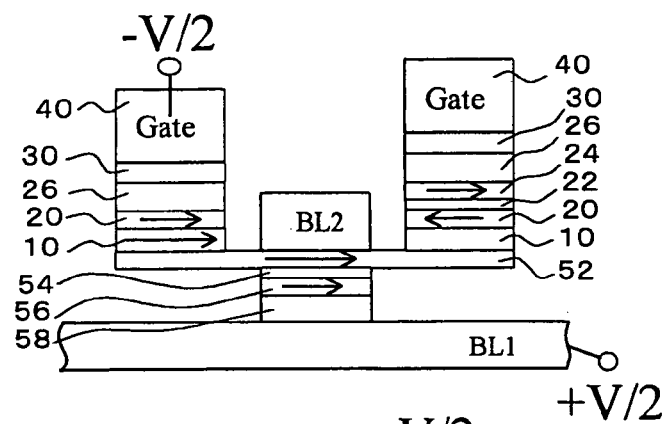
Figure 8C:
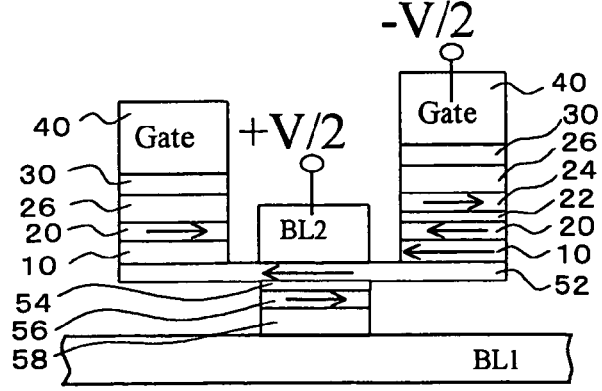
Figure 8D:
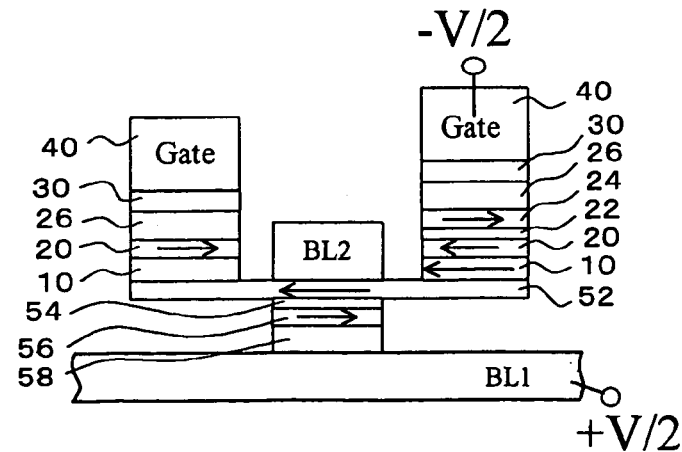

Here, FIGS. 8A and 8B express the case where "0" of the binary information is written in, and FIG. 8C and 8D express the case where "1" is written in.

In order to rewrite the spin information on a memory cell, the voltage of minus is applied to the switching elements 1C or 1D, or the voltage of plus is applied to the bit lines BL1 or BL2. Then, holes are injected into the magnetic semiconductor layer 10, and the mimetic semiconductor layer 10 performs a magnetic phase transition into a ferromagnetic state from a paramagnetic state.

The direction of the spin of the magnetic semiconductor layer 10 (ferromagnetic state) will be prescribed towards the magnetization M1 of the ferromagnetic layer 20 by the magnetic interaction with the ferromagnetic layer 20 prepared in contact with the magnetic semiconductor layer 10 in that case.

Since the record layer 52 of a memory cell is also in contact with this magnetic semiconductor layer 10 in the case of the memory element of the first type, by the interaction of the record layer 52 and the magnetic semiconductor layer 10, the record layer 52 of a memory cell is 1 also specified in the direction of the spin M2 of the magnetic semiconductor layer 10, and carry out the magnetic spin reversal.

Figure 9A:
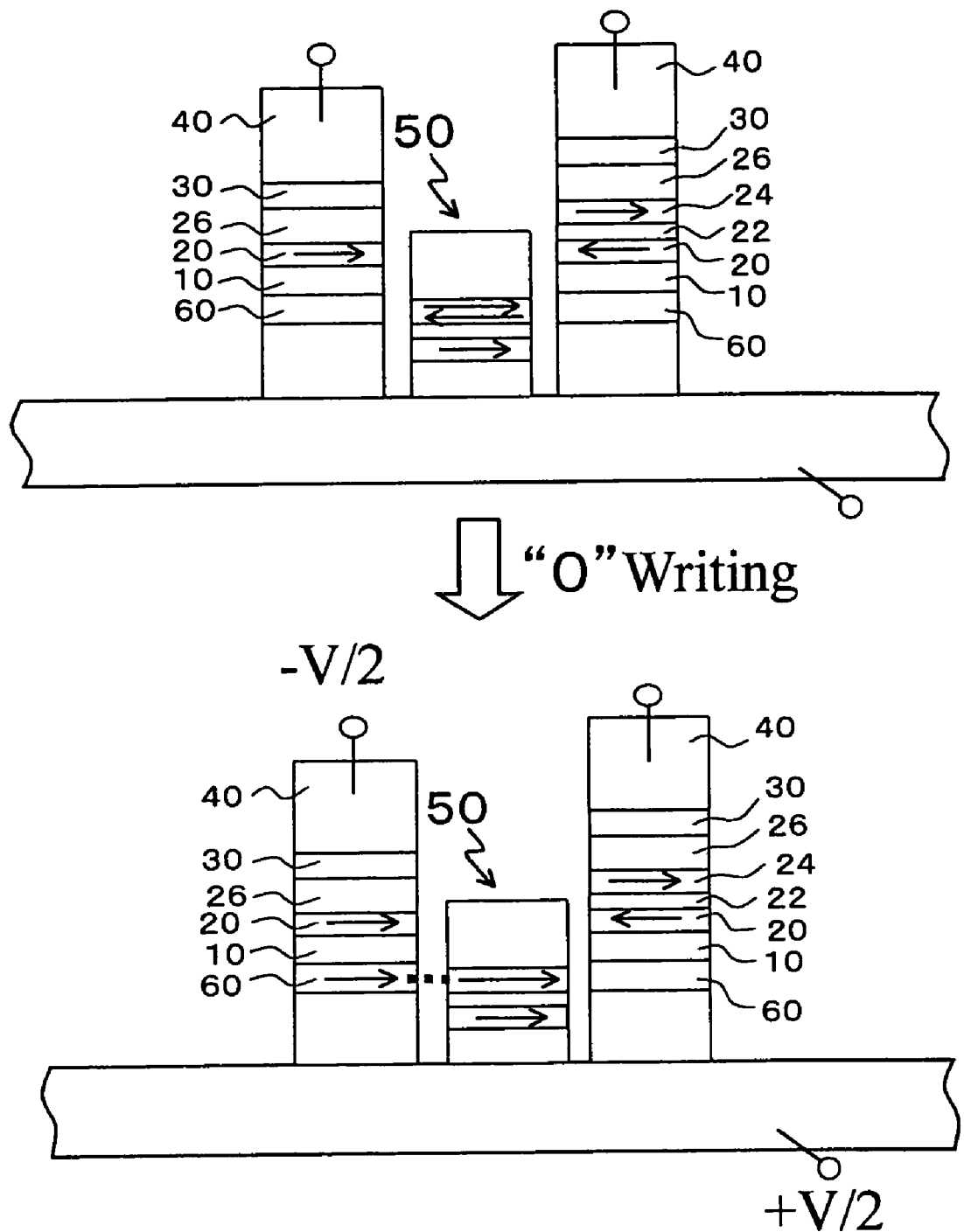
FIGS. 9A and 9B are conceptual diagrams for explaining the writing in the memory element of the fist type illustrated in FIG. 6.
Figure 9B:
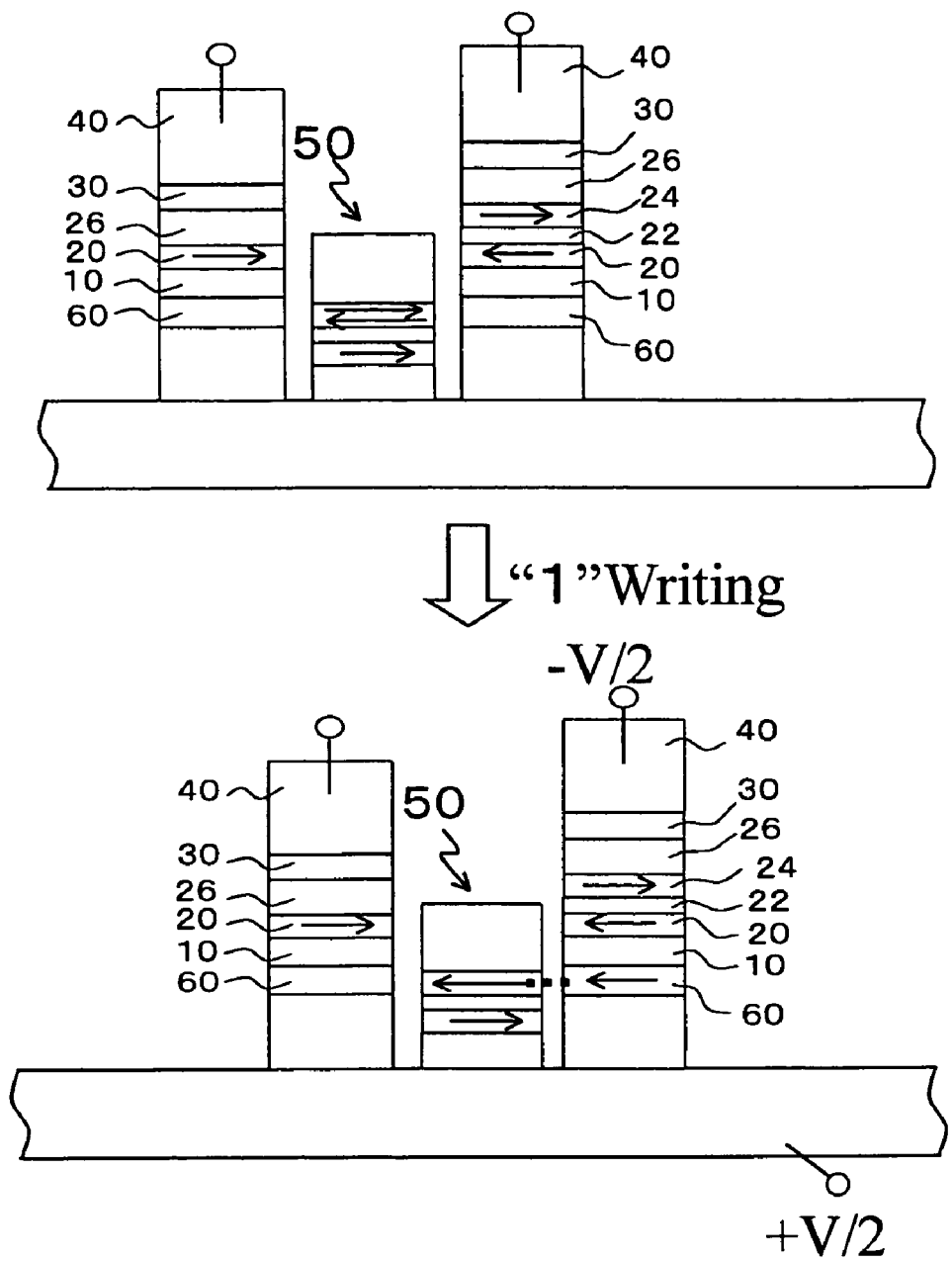

FIGS. 9A and 9B are conceptual diagrams for explaining the writing in the memory element of the second type illustrated in FIG. 6. The same symbols are given to the same elements as what were mentioned above with reference to FIGS. 1A through 8D about these diagrams and detailed explanation is omitted.

In the case of the example expressed in FIGS. 9A and 9B, the ferromagnetic layer 60 for applying a magnetic field to the record layer 52 is formed to adjoin the magnetic semiconductor layer 10. And the direction of the spin of the ferromagnetic layer 60 is prescribed by the interaction of the magnetic semiconductor layer 10 and the ferromagnetic layer 60, a magnetic field is applied to the record layer 52 of a memory cell by the magnetic field (stray field) from the ferromagnetic layer 60, and the record layer 52 carries out magnetic spin reversal.

In the cases of the structures illustrated in FIGS. 8A through 9B, in the switching elements 1D and 1F, in order to specify the direction of the magnetic spin M1 of the ferromagnetic layer 20 prepared in order to specify the direction of the magnetization spin M2 of the magnetic semiconductor layer 10, the anti-ferromagnetic layer 26 is given, and laminating is carried out through the ferromagnetic layer 24 and the non-magnetic layer 22.

By employing such structures, the direction of the pinned spin of the ferromagnetic layer 20 can be easily reversed 180 degrees to the direction of the pinned spin of the ferromagnetic layer 20 of the opposite switching elements 1C and 1E.

Figure 10:
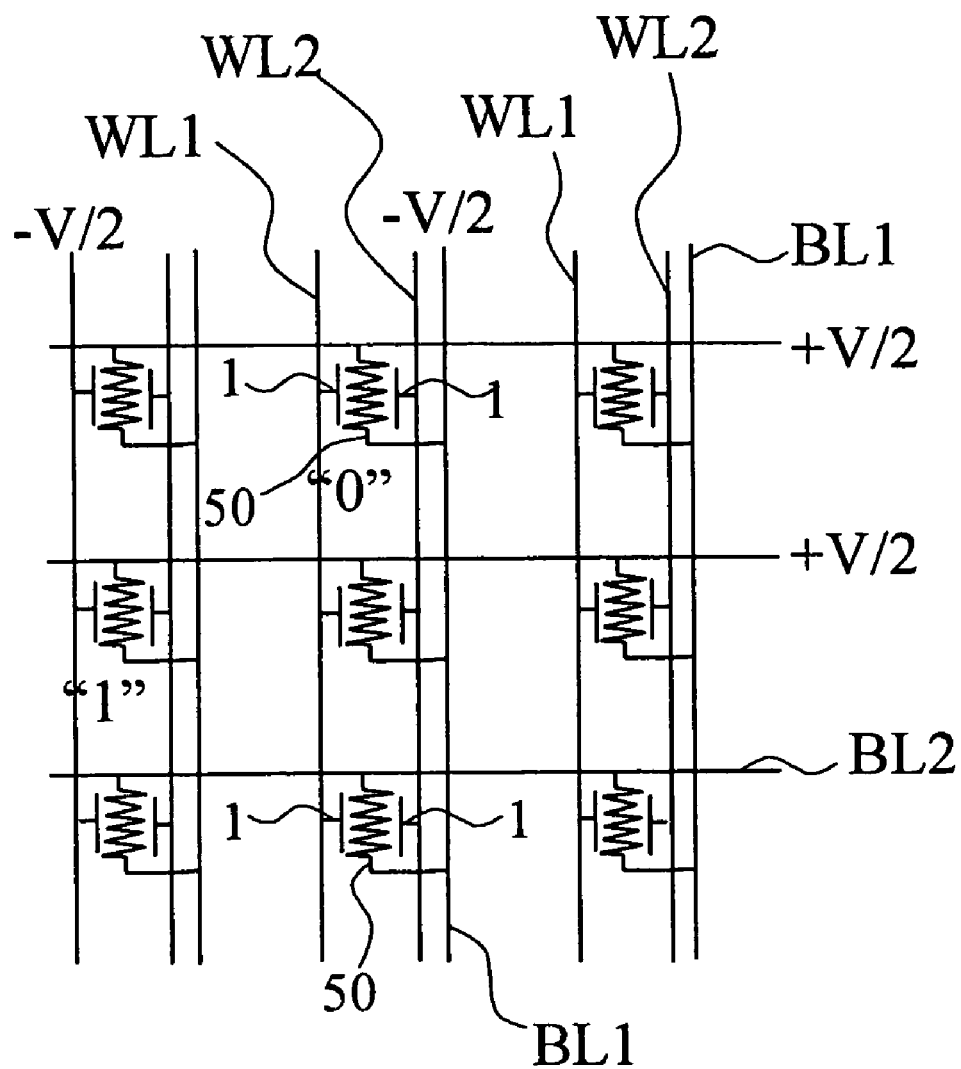
FIG. 10 is a conceptual diagram which illustrates the matrix structure of the magnetic memory according to an embodiment of the invention.

FIG. 10 is a conceptual diagram which illustrates the matrix structure of the magnetic memory according to an embodiment of the invention. The memory cells which consist of a switching element 1 and a magneto resistance effect element 50 are arranged in the position of the crossing point of the bit lines BL1 and BL2 wired in the shape of a matrix, and the word lines WL1 and WL2 as expressed in this diagram. And ferromagnetism is induced in one magnetic semiconductor layer 10 of a pair of switching elements combined with the magnetoresistance effect element 50, and a predetermined magnetization spin is made to form by applying predetermined voltage to these bit line or a word line suitably. Then it is possible to write in by this magnetization spin by reversing the magnet ion of the record layer of the adjoining magnetoresistance effect element 50.

In order to read the recorded information on the magnetoresistance effect element 50, the bit lines BL1 and BL2 are chosen, and the sense current which flows through the magnetoresistance effect element connected to these is detected.

As the concrete architecture for read-out, the architecture using a MOS switch, a diode, etc., the architecture (simple matrix type) which has a transistor for selection in the circumference part of the bit lines and the word lines arranged in the shape of a matrix can be used as explained in full detail below.

By using the magnetic switching element of the embodiment, it becomes possible to control the direction of the magnetic moment of the record layer 52 of the magnetoresistance effect element 50 by applying a gate voltage through the gate insulation film 30. As a result, it becomes possible to write in not by current writing but by applying a voltage, and power consumption becomes remarkably small and can realize the small highly efficient solid-state magnetic memory which also reduced the scale and size of a circumference circuit in connection with it.

The magnetization direction of the record layer 52 of the magnetoresistance effect element 50 used in the invention does not necessarily need to be of a straight rectangular shape, as explained in full detail below.

FIGS. 11A through 11F are conceptual diagrams which illustrate the plane forms and their magnetization direction of the record layer 52. The record layer 52 of the magnetoresistance effect element can have various plane form, as illustrated in these diagrams, and the magnetization M3 formed there forms various "edge domains" according to the form.

Figure 11A:
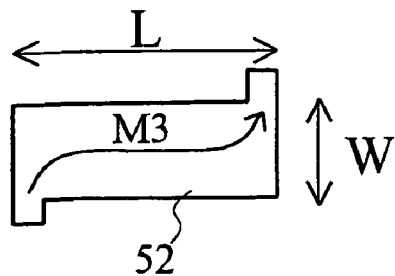
FIGS. 11A through 11F are diagrams which illustrate the plane forms and their magnetization direction of the record layer 52.
Figure 11D:
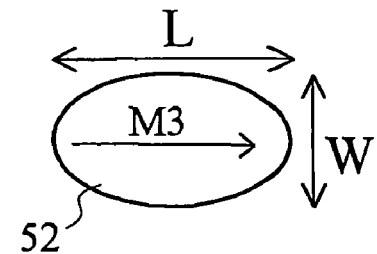

Namely, the magnetic record layer 52 may have a plane form where projects are added to both diagonal edges of a rectangular as shown in FIG. 11A. The magnetic record layer 52 may also have a plane form of a parallelogram as shown in FIG. 11B, a lozenge as shown in FIG. 11C, an ellipse as shown in FIG. 11D, an edge inclination shape as shown in FIG. 11E or an elongated octagon as shown in FIG. 11F.

Figure 11B:
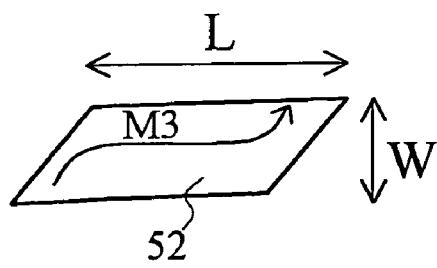
Figure 11E:
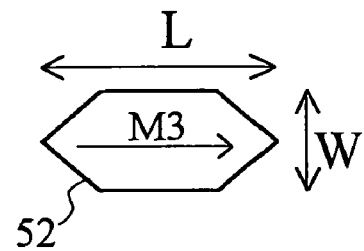
Figure 11C:
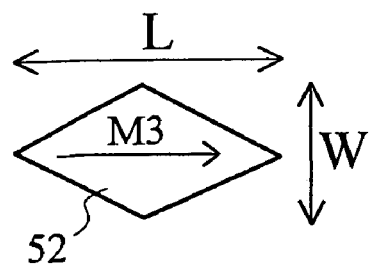
Figure 11F:
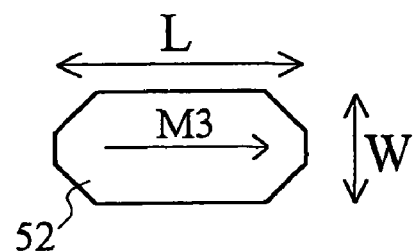

And in the case of the asymmetrical form as shown in FIGS. 11A and 11B, magnetization M3 is crooked by formation of the edge domain instead of the shape of a straight line. In the embodiment of the invention, it is possible to use the record layer which has the magnetization M3 crooked in this way.

Such asymmetrical form is easily produced by making the reticle used in photo lithography into asymmetrical form pattern. By forming the record layer 52 as shown in FIGS. 11A through 11F, a switching magnetic field can be reduced. According to nation of the Inventors, when the record layer 52 is formed as the elongated octagon as shown in FIG. 11F, it became possible to reduce the switching magnetic field notably.

In addition, although the angle parts are round in fact in many cases in the form where the magnetic record layer 52 is formed into the shapes as shown in FIGS. 11A–11C, 11E, and 11F when carrying out a patterning process. However, such rounded shape may be acceptable in the invention.

With regard to the ratio of the length L and the width W, L/W, of the magnetic record layer 52 of the magnetoresistance effect element, it is desirable that the ratio L/W is larger than 1.2. And it is also desirable to give an uniaxial anisotropy in the direction of the length L. It is because the direction of magnetization M3 can be mutually specified in the two directions for the contraries certainly and easily.

Next, some examples of the laminating structure of the magnetoresistance effect clement which can be used for the magnetic memory of the embodiment of the invention are explained.

Figure 12:
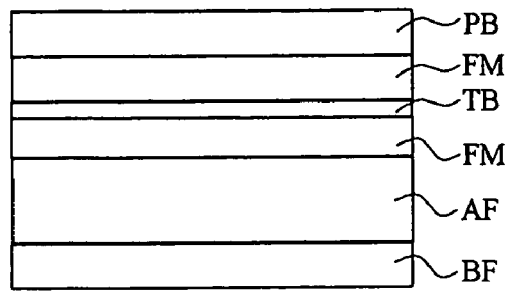
FIG. 12 is a conceptual diagram showing a cross-sectional structure of the magnetoresistance effect element having a ferromagnetic single tunnel junction.
Figure 13:
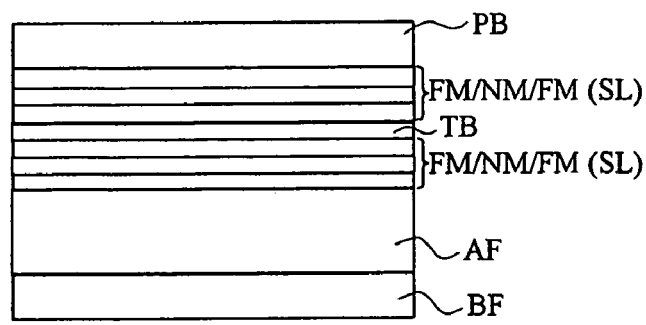
FIG. 13 is a conceptual diagram showing a cross-sectional structure of the magnetoresistance effect element having a ferromagnetic single tunnel junction.

FIGS. 12 and 13 are a conceptual diagrams showing the cross-sectional structures of the magnetoresistance effect element of having ferromagnetic single tunnel junction. That is, in the case of the magnetoresistance effect clement shown in FIG. 12, the laminating of the anti-ferromagnetic layer AF, the ferromagnetic layer FM1, the tunnel barrier layer TB, the ferromagnetic layer FM2, and the protection layer PB is carried out to this order on the ground layer BF.

The ferromagnetic layer FM1 which adjoins the anti-ferromagnetic layer AF acts as a magnetization pinned layer (pinned layer), and the ferromagnetic layer FM2 which is stacked on the tunnel barrier layer TB acts as a record layer (free layer).

In the case of the magnetoresistance effect element shown in FIG. 13, in the upper and lower sides of the tunnel barrier layer TB, the stacked structures SL having the ferromagnetic layer FM, the non-magnetic layer NM, and the ferromagnetic layer FM are formed, respectively. In this case, the stacked structure SL interposed between the anti-ferromagnetic layer AF and the tunnel barrier layer TB also acts as a magnetization pinned layer, and the stacked structure SL provided on the tunnel barrier layer TB acts as a record layer.

Figure 14:
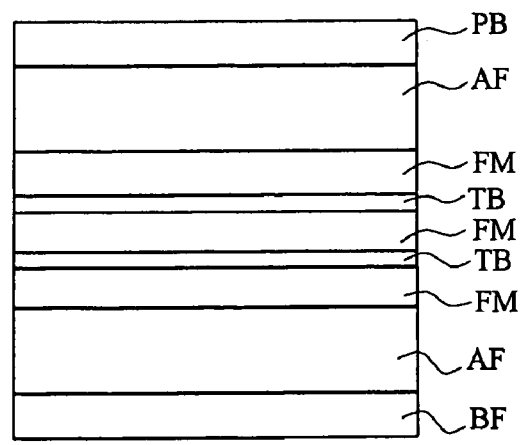
FIG. 14 is a conceptual diagram showing a cross-sectional structure of the magnetoresistance effect element having ferromagnetic double tunnel junctions.
Figure 15:
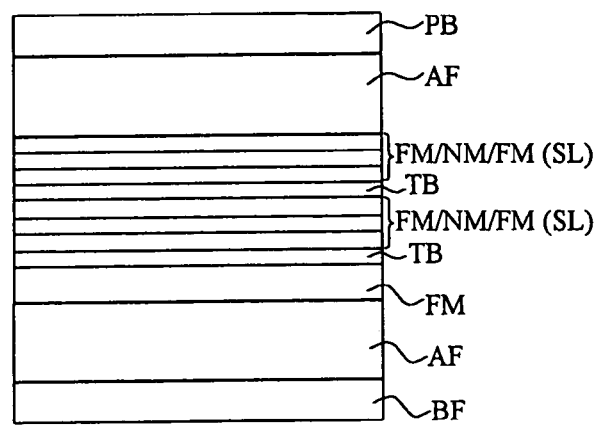
FIG. 15 is a conceptual diagram showing a cross-sectional structure of the magnetoresistance effect element having ferromagnetic double tunnel junctions.
Figure 16:
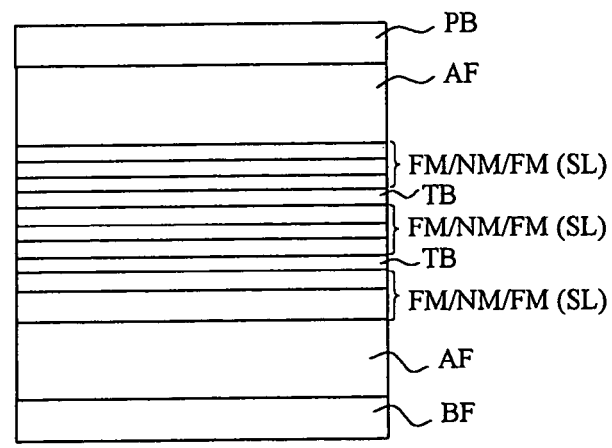
FIG. 16 is a conceptual diagram showing a cross-sectional structure of the magnetoresistance effect element having ferromagnetic double tunnel junctions.

FIGS. 14 through 16 are concepatual diagrams which illustrate the cross-sectional structure of the magnetoresistance effect elements of having ferromagnetic double tunnel junctions. The same symbols are given to the same elements as what were mentioned with reference to FIGS. 12 and 13, and detailed explanation is omitted.

In the case of the structure illustrated in FIGS. 14 through 16, the two tunnel barrier layers TB are formed, and the stacked structures SL of the ferromagnetic layer FM, or the ferromagnetic layer FM and the non-magnetism layer NM are formed in the upper and lower sides. In the cases of the double tunnel junction element illustrated here, the ferromagnetic layers FM which adjoin the upper and lower anti-ferromagnetism layer AF respectively act as magnetization pinned layers, and the ferromagnetic layer FM provided between the two tunnel barrier layers TB acts as a record layer.

If such a double tunnel junction structure is adopted, it is advantageous at the point which can increase the current change with respect to the magnetization direction of a record layer.

In addition, the magnetoresistance effect element used in the magnetic memory of the invention is not limited to what was illustrated in FIGS. 12 through 16, but the so-called magnetoresistance effect element of the "spin valve structure" to which the laminating of the fist ferromagnetic layer, a non-magnetism layer, and the second ferromagnetic layer is carried out can also be used.

Also when either structure is adopted as a magnetic resistance effect element one ferromagnetic layer can be used as a "magnetization pinned layer" in which the magnetization direction is fixed substantially, and another ferromagnetic layer can be used as a "magnetic record layer" in which the magnetization direction is controllable by applying a magnetic field from the outside.

Moreover, the ferromagnetic layer formed to adjoin the anti-ferromagnetic layer can also be used as a record layer depending on the read-out method, as explained in full detail below.

As the ferromagnetic material which can be used as a magnetization pinned layer in these magnetoresistance effect elements, for example, Fe (iron), Co (cobalt), nickel (nickel), or these alloys, magnetite having a large spin, polarization ratio, $CrO_2$, or $RXMnO_{3-y}$ (where R expresses a rare earth element, and X expresses calcium (calcium), Ba (barium), or Sr (strontium)) can be used.

Further, as the ferromagnetic material which can be used as a magnetization pinned layer in these magnetoresistance effect elements, Heusler alloys, such as NiMnSb (nickel manganese antimony), PtMnSb (platinum manganese antimony), Co2MnGe, and Co2MnSi, can be used. Moreover, the magnetic semiconductors can be used as the material of the pinned layer. Such a magnetic semiconductors include wide gap semiconductors, such as (In, Mn)As, (Ga, Mn)As, (Zn, Mn)Te, GaN, ZnO, and $TiO_2$, $(Cd_{1-x}Mn_x)GeP_2$, CrAs, or (Ga, Cr)As, doped with a transition metal element as mentioned above.

A magnetic semiconductor can realize various magnetic states such as anti-ferromagnetic state, paramagnetic state, and ferromagnetic state with the kind and concentration of transition metal element doped to the wide gap semiconductor. Therefore, it is also possible to use a magnetic semiconductor for the ferromagnetic layer, the anti-ferromagnetic layer, or the non-magnetic layer in the magnetic resistance effect element illustrated in FIGS. 12 through 16.

Alternatively, by adding the dopant into the magnetic semiconductor with a dilute doping level, it is possible to induce a magnetic property only when a voltage is applied to the magnetic semiconductor. Such a magnetic semiconductor can be also used. If ZnO is taken for an example, and anti-ferromagnetism can be acquired when Mn is doped to ZnO, ferromagnetism can be acquired when V, Cr, Fe, Co, or nickel is doped, and paramagnetizm can be acquired when Ti or Cu is doped, for example.

When Mn is doped to GaN, there is no necessity to dope hole as hole is automatically doped unlike ZnO. This is because Ga is trivalence and Mn is divalence.

When Mn is doped into GaN, ferromagnetism can be acquired As for the magnetization pinned layer which consists of such material, it is desirable to have unidirectional anisotropy. With regard to the thickness of these layers, it is desirable to range between 0.1 nm and 100 nm. Furthermore, in order to prevent the superparamagnetizm, it is more desirable to make the thickness not smaller than 0.4 nm.

Moreover, it is desirable to provide an anti-ferromagnetic film near the magnetization pinned layer in order to fix the magnetization thereof. As such an anti-ferromagnetic film, Fe (iron)-Mn (manganese), Pt (platinum)-Mn (manganese), Pt (platinum)-Cr (chromium)-Mn (manganese), Ni (nickel)-Mn (manganese), Ir( iridium)-Mn (manganese), NiO (oxidization nickel) and $Fe_2O_3$ (iron oxide), or the magnetic semiconductor mentioned above can be mentioned.

Moreover, in these magnetic materials, non-magnetic elements such as Ag (silver), Cu (copper), Au (gold), Al (aluminum), Mg (magnesium), Si (silicone), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium), or H (hydrogen) can be added in order to adjust the magnetic properties, or other various properties, such as crystallinity, mechanical properties, and the chemical properties.

On the other hand, a stacked structure having a ferromagnetic layer and a non-magnetic layer can be used as a magnetization pinned layer. For example, the three-layered structure of the (ferromagnetic layer)/(nonmagnetic layer)/(ferromagnetic layer) which is illustrated in FIG. 13 etc. can be used. In this case, it is desirable to make an anti-ferromagnetic interaction work between the ferromagnetic layers on both sides through the non-magnetic layer.

As a specific method to fix the magnetization of the magnetic layer in one direction, three-layered structure such as, Co (Co—Fe)/Ru/Co (Co—Fe), Co (Co—Fe)/Ir/Co (Co—Fe), Co (Co—Fe)/Os/Co (Co—Fe) and (ferromagnetic layer)/(magnetic semiconductor nonmagnetic layer)/(magnetic semiconductor ferromagnetic layer) can be used. In this case, it is desirable to provide an anti-ferromagnetic layer to adjoin the three-layered structure.

As such an anti-ferromagnetic layer, Fe—Mn, Pt—Mn, Pt—Cr—Mn, Ni—Mn, Ir—Mn, NiO, $Fe_2O_3$ and magnetic semiconductors can be used. By employing this structure, magnetization of the magnetization pinned layer can be fixed securely, a stray field from the magnetization pinned layer can be reduced (or controlled), and magnetization shift can be controlled by changing the thicknesses of the two ferromagnetic layers of the magnetization pinned layer.

On the other hand, as the material of a magnetic record layer (free layer), the same as the magnetization pinned layer can be used. For example, Fe (iron), Co (cobalt), nickel (nickel), or these alloys, magnetite having a large spin polarization ratio, $CrO_2$, or $RXMnO_{3-y}$ (where R expresses a rare earth element, and X expresses calcium (calcium), Ba (barium), or Sr (strontium)) can be used. Further, as the ferromagnetic material which can be used as a magnetic record layer in these magnetoresistance effect elements, Heusler alloys, such as NiMnSb (nickel manganese antimony), PtMnSb (platinum manganese antimony), $Co_2MnGe$, and $Co_2MnSi$, can be used.

The ferromagnetic layer as the magnetic record layer made of these materials may desirably have an uniaxial anisotropy parallel to its film plane.

With regard to the thickness of these layers, it is desirable to range between 0.1 nm and 100 nm. Furthermore, in order to prevent the superparamagnetizm, it is more desirable to make the thickness not smaller than 0.4 nm.

Alternatively, a two-layered structure of (soft magnetic layer)/(ferromagnetic layer), or a three-layered structure of (ferromagnetic layer)/(soft magnetic layer)/(ferromagnetic layer) can be used as the magnetic record layer.

By using a three-layered structure of (ferromagnetic layer)/(nonmagnetic layer)/(ferromagnetic layer), or five-layered structure of (ferromagnetic layer)/(nonmagnetic layer)/(ferromagnetic layer)/(nonmagnetic layer)/(ferromagnetic layer) as the record layer, and by adjusting the strength of the interaction between the ferromagnetic layers, it becomes possible to suppress an increase of a power consumption even if the cell width of the record layer as the memory cell becomes sub-micron.

In the case of the five-layered structure, the intermediate ferromagnetic layer may desirably be a soft magnetic layer, or a ferromagnetic layer which is divided by a non-magnetic.

It is also noted that in the case of the record layer, in these magnetic materials, non-magnetic elements such as Ag (silver), Cu (copper), Au (gold), Al (aluminum), Mg (magnesium), Si (silicone), Bi (bismuth). Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium), or H (hydrogen) can be added in order to adjust the magnetic properties, or other various properties, such as crystallinity, mechanical properties, and the chemical properties.

On the other hand, when a TMR element is used as the magnetoresistance effect element, $A_2O_3$ (aluminum oxide), $SiO_2$ (silicone oxide), MgO (magnesium oxide), AlN (aluminum nitride), $Bi_2O_3$ (bismuth oxide). $MgF_2$ (magnesium fluoride), $CaF_2$ (calcium fluoride), $SrTiO_2$ (titanium strontium oxide), $AlXO_3$ (X is rare earth elements, such as La, Hf, and Er), Al—N—O (aluminum nitride oxide), a non-magnetic semiconductor (InMn, GaN, GaAs, $TiO_2$, Zn, Te and these doped with transition metal), etc. can be used as the material of the tunnel barrier layer TB prepared between a magnetization pinned layer and a magnetization record layer.

These compounds may not necessarily have a perfect stoichiometric composition, but may have deficiency or excess of the component elements such as oxygen, nitrogen and fluoride. Moreover, the insulated layer (dielectric layer) may preferably thin enough to make a tunneling current flow therethrough. The practical thickness may preferably equal to or smaller than 10 nm.

Such a magnetoresistance effect element can be formed on a predetermined substrate using the usual thin film formation means, such as various sputtering methods, vapor-depositing method, the molecule beam epitaxy method, and CVD method.

As a substrate in this case, various kinds of substrates, such as. Si (silicone), $SiO_2$ (oxidization silicone), $Al_2O_3$ (aluminum oxide), spinel, AlN (alunium nitride), GaAs, and GaN, can be used, for example. Moreover, as a base layer of a protective layer, such as Ta (tantalum), Ti (titanium), Pt (platinum), Pd (palladium), Au(gold), Ti/Pt, Ta/Pt, Ti/Pd, Ta/Pd, Cu (copper), Al—Cu, Ru (ruthenium), Ir (iridium) and Os (osmium), GaAs, GaN, ZnO, $TiO_2$, etc. can be used.

Moreover, as the material of the ferromagnetic layers, elements, such as Pt and Pd, may be added into Fe, Co, Ni, or these alloys in order to form a semi-hardmagnetic film.

In the above, the basic structure of the magnetoresistance effect element in the magnetic memory of the embodiment and a switching element and their materials are explained.

Next, an example is given and explained about the cell structure of the magnetic memory according to an embodiment of the invention. Fist, an example of the architecture for read-out employable as the magnetic memory of the embodiment of the invention is explained.

FIGS. 17 through 21 are conceptual diagrams showing the first example of the architecture for read-out employable as the magnetic memory of the embodiment of the invention. That is, these diagrams shows cross-sectional structures of a memory array. The same symbols are given to the same elements as what was mentioned above about FIGS. 1A through 16 about these drawings, and detailed explanation is omitted.

Figure 17:
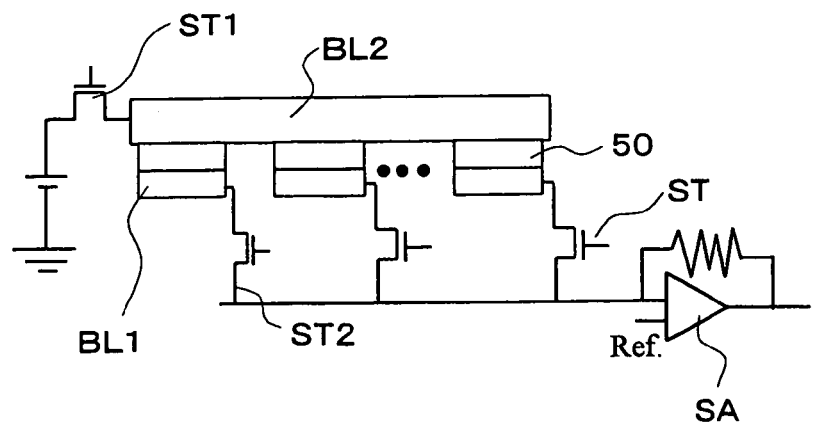
FIG. 17 is a conceptual diagram showing the first example of the architecture for read-out employable for the magnetic memory according to an embodiment of the invention.

The architecture shown in FIG. 17 is a read-out architecture of the so-called "simple matrix type" by which two or more magnetoresistance effect elements 50 are connected to the bit lines BL1 and BL2 for read-out wired in the shape of a matrix.

In the case of read-out, by choosing the bit lines BL1 and BL2 with the selection transistor ST (ST1, ST2), sense current can be passed for the target magnetoresistance effect element 50, and the sense amplifier SA can detect it.

Figure 18:
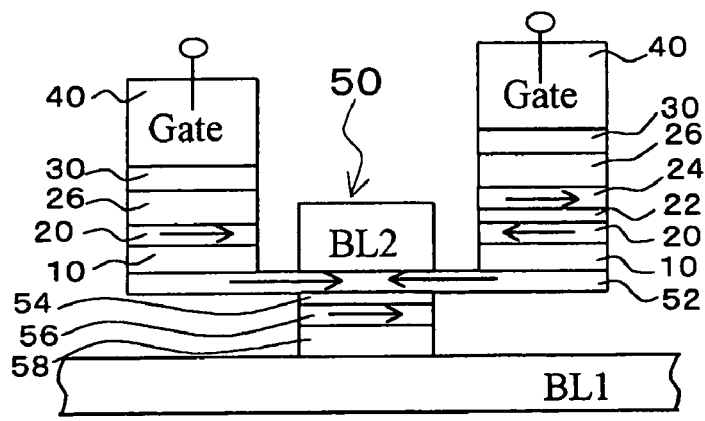
FIG. 18 is a conceptual diagram showing an example of the magnetic memory of a simple matrix type having memory cells of the first type illustrated in FIG. 5 according to an embodiment of the invention.

FIG. 18 shows an example of the magnetic simple matrix type memory using the memory cell of the first type illustrated in FIG. 5.

Figure 19:
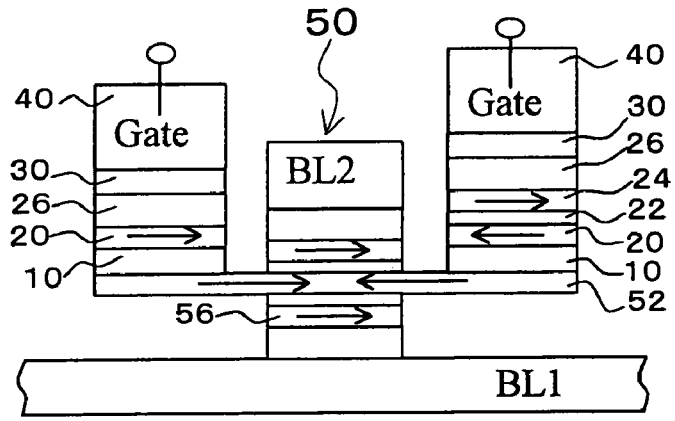
FIG. 19 is a conceptual diagram showing an example where the magnetoresistance effect element 50 has ferromagnetic double tunnel junctions.

FIG. 19 shows an example where the magnetoresistance effect element 50 has ferromagnetic double tunnel junctions.

Figure 20:
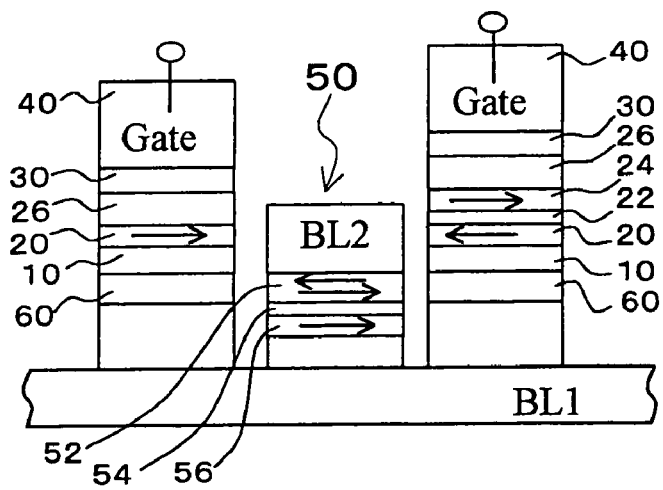
FIG. 20 is a conceptual diagram showing an example of the magnetic memory of a simple matrix type having memory cells of the second type illustrated in FIG. 6 according to an embodiment of the invention.

On the other hand, FIG. 20 shows an example of the magnetic simple matrix type memory using the memory cell of the second type illustrated in FIG. 6.

Figure 21:
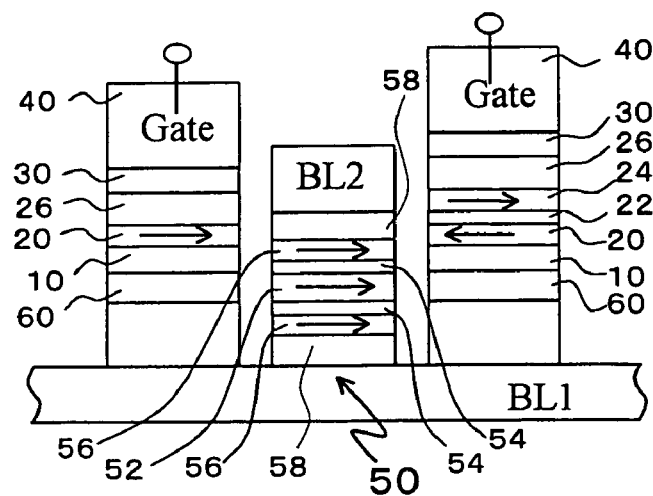
FIG. 21 is a conceptual diagram showing an example where the magnetoresistance effect element 50 has ferromagnetic double tunnel junctions.

FIG. 21 shows an example where the magnetoresistance effect element 50 has ferromagnetic double tunnel junctions.

In every structure shown in FIGS. 17 through 21, the writing to the record layer 52 impresses voltage to the gate electrode 40, and is performed by pouring an electron or an electron hole (hole) into the magnetic semiconductor layer 10.

Figure 22:
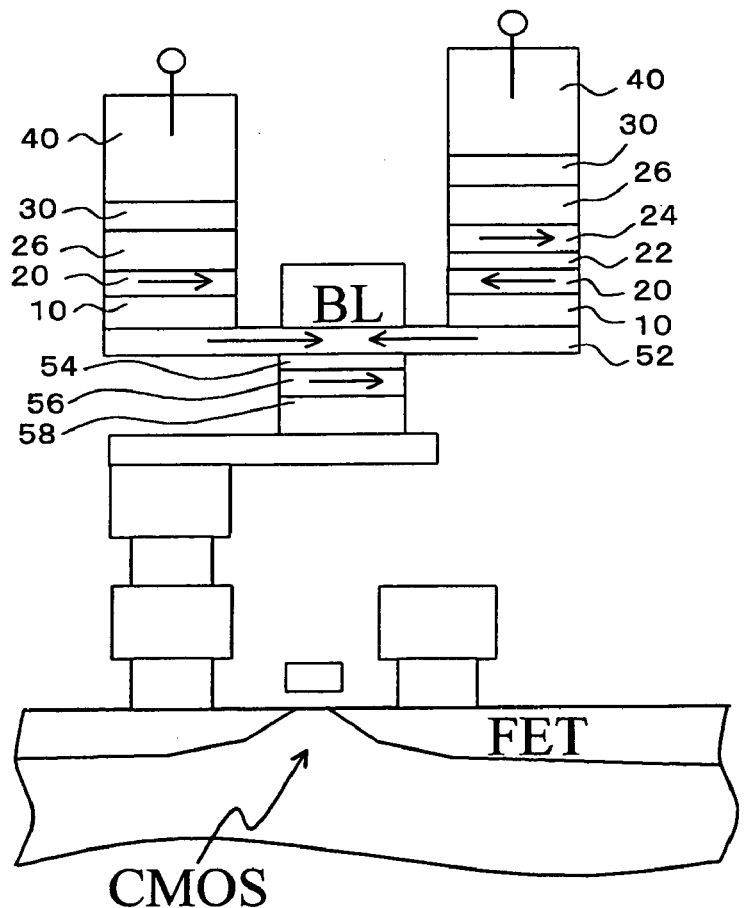
FIG. 22 is a conceptual diagram showing the second example of the architecture for read-out employable for the magnetic memory according to an embodiment of the invention.
Figure 23:
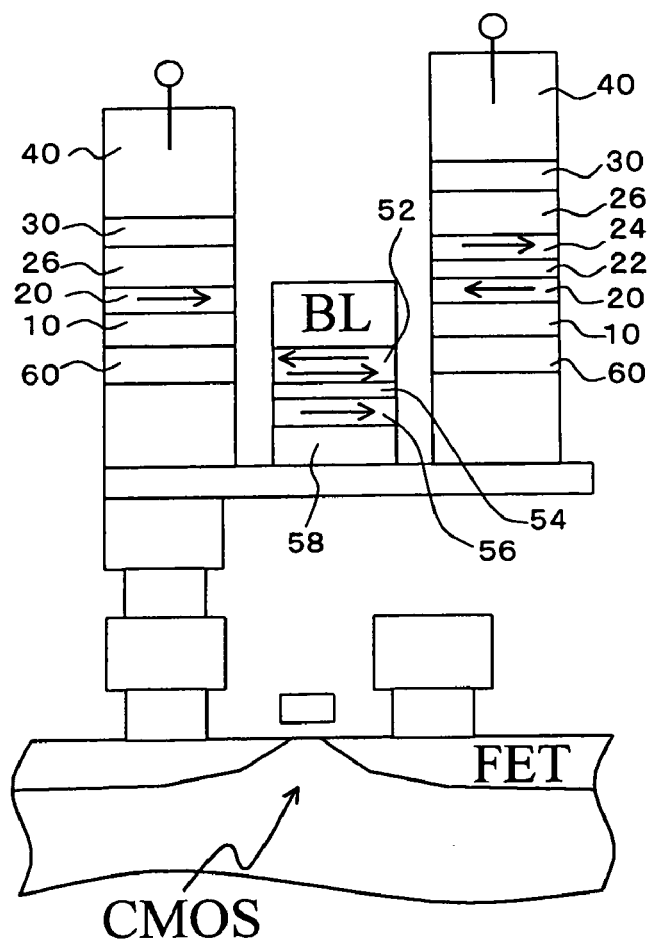
FIG. 23 is a conceptual dram showing the second example of the architecture for read-out employable for the magnetic memory according to an embodiment of the invention.

Next, FIGS. 22 and 23 are conceptual diagrams showing the second example of the architecture for read-out employable as the magnetic memory according to the embodiment of the invention. That is, this example is an example of structure using CMOS as the architecture for read-out.

When CMOS is used, read-out is performed by turning the lower selection transistor ST on and by passing a sense current through the magnetoresistance effect element 50 via the bit line BL1.

On the other hand, writing is performed by applying a voltage to the gate electrode 40 of one of switching elements, and thereby injecting hole into the magnetic semiconductor layer 10.

Here, FIG. 22 shows the case where the memory cell of the first type is used, and FIG. 23 shows the case where the memory cell of the second type is used.

Figure 24:
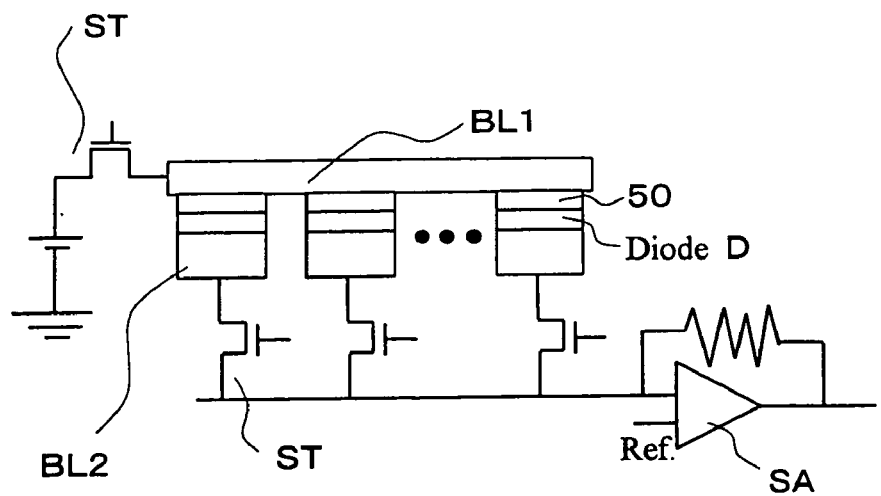
FIG. 24 is a conceptual diagram showing the third example of the architecture for read-out employable for the magnetic memory according to an embodiment of the invention.
Figure 25:
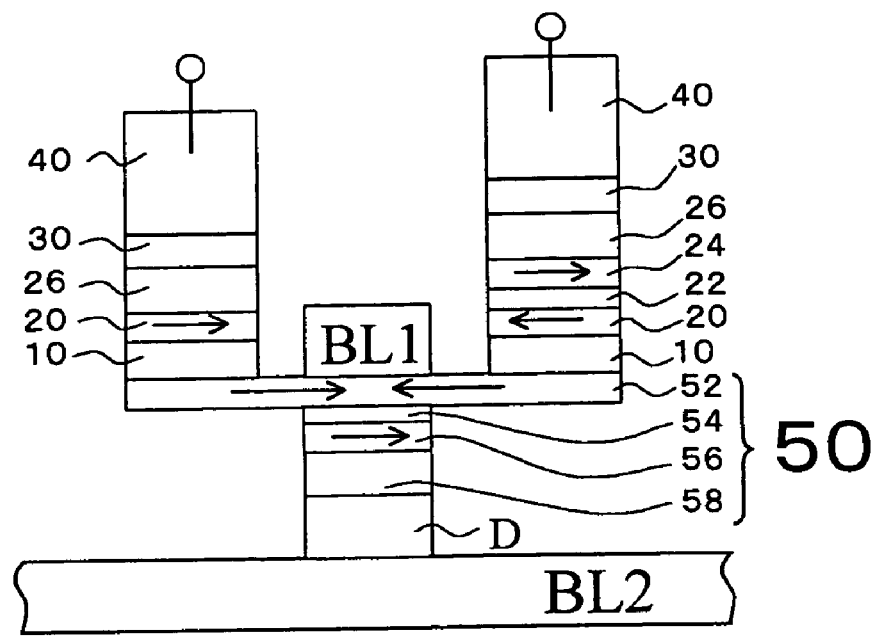
FIG. 25 is a conceptual diagram showing the third example of the architecture using the memory cell of the first type for read-out employable for the magnetic memory according to an embodiment of the invention.
Figure 26:
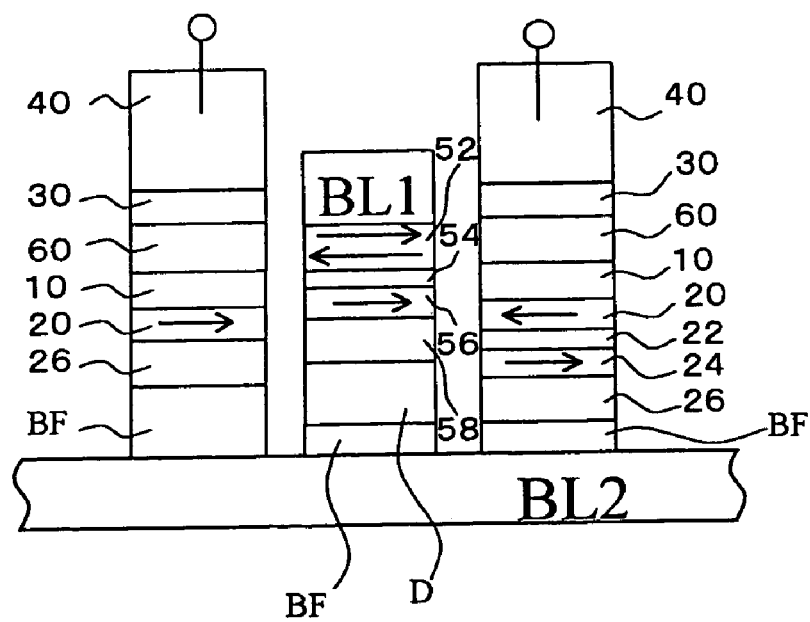
FIG. 26 is a conceptual diagram showing the third example of the architecture using the memory cell of the second type for read-out employable for the magnetic memory according to an embodiment of the invention.

FIGS. 24 through 26 are conceptual diagrams showing the third example of the architecture for read-out employable as the magnetic memory according to an embodiment of the invention. That is, in this architecture, two or more magnetoresistance effect elements 50 are connected in parallel to the bit line BL1 for read-out.

At the time of read-out, the bit lines BL1 and BL2 connected to the target magnetoresistance effect element 50 are chosen with the selection transistors ST, respectively, and the sense amplifier SA detects the current flowing therethrough. Diode D has the role which intercepts the detour current which flows through other magnetoresistance effect elements 50 currently wired in the shape of a matrix when the read-out is performed.

Writing is performed by applying a voltage to the gate electrode 40 of one of switching elements, and by injecting hole into the magnetic semiconductor.

FIG. 25 shows the case where the memory cell of the first type is used, and FIG. 26 shows the case where the memory cell of the second type is used, respectively.

Next, the fourth example of the architecture employable as the magnetic memory according to an embodiment of the invention is explained.

Figure 27:
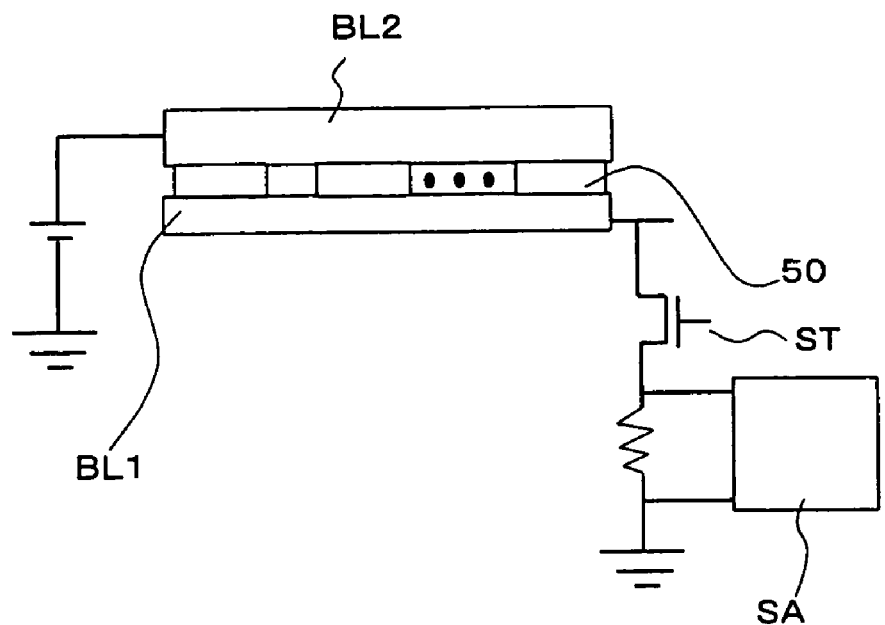
FIG. 27 is a conceptual d o showing the fourth example of the architecture for read-out employable for the magnetic memory according to an embodiment of the invention.
Figure 28:
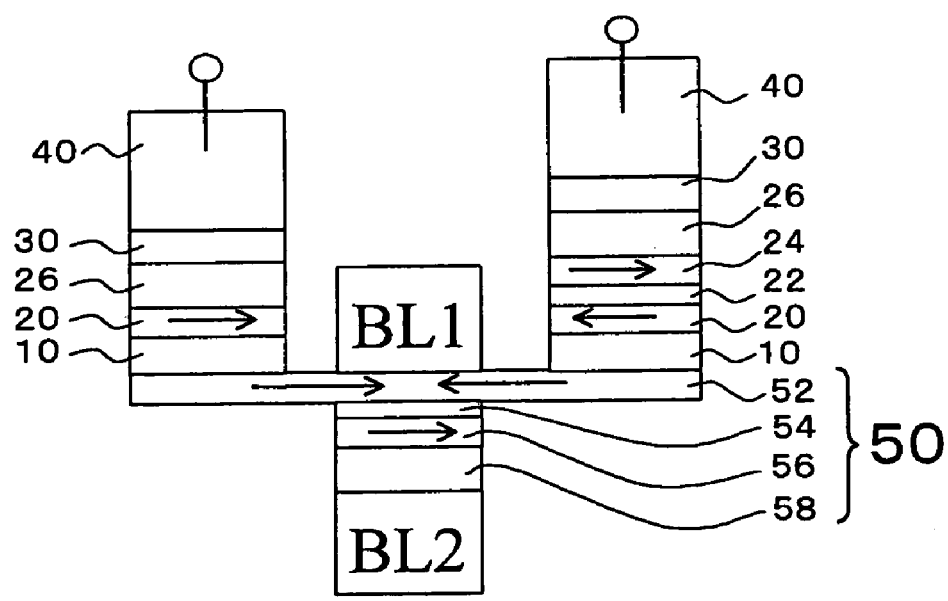
FIG. 28 is a conceptual diagram showing the fourth example of the architecture using the memory cell of the first type for read-out employable for the magnetic memory according to an embodiment of the invention.
Figure 29:
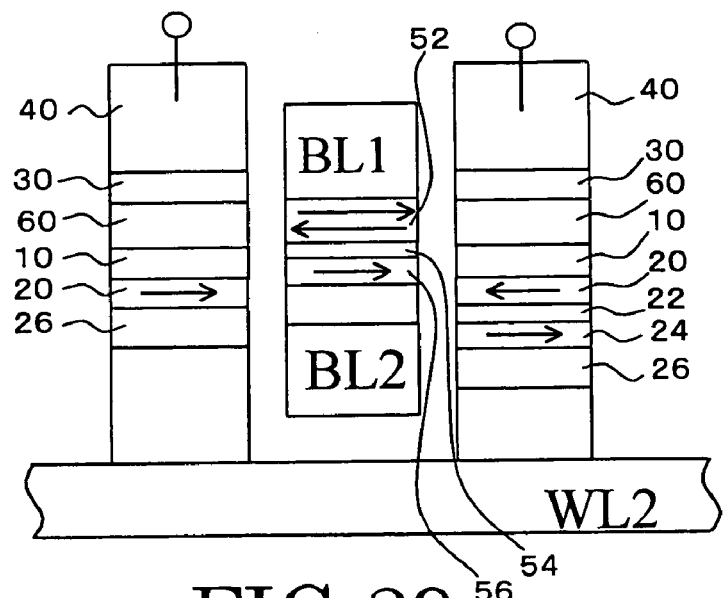
FIG. 29 is a conceptual diagram showing the fourth example of the architecture using the memory cell of the second type for read-out employable for the magnetic memory according to an embodiment of the invention.

FIGS. 27 through 29 are conceptual diagrams showing the fourth example of the architecture for read-out. That is, these diagrams show the cross-sectional structure of a memory array. In this architecture, the structure of the "ladder type" where two or more magnetic resistance effect elements 50 are connected in parallel between the bit line BL1 for read-out and the bit line BL2 for read-out is adopted.

Writing is performed by applying a voltage to the gate electrode 40 of one of the switching elements that are connected to the magnetoresistance effect element 50, and by injecting hole into the magnetic semiconductor layer 10.

FIG. 28 shows the case where the memory cell of the first type is used, and FIG. 29 shows the case where the memory cell of the second type is used, respectively.

On the other hand, in the case of read-out, a voltage is applied between the bit lines BL1 and BL2. Then, current flows for all the magnetoresistance effect elements 50 connected in parallel between these bit lines. While the sense amplifier SA detects the sum total of this current, a writing voltage is applied to a switching element corresponding to the target magnetoresistance effect element 50, and thereby magnetization of the magnetic record layer 52 of the target magnetoresistance effect element 50 is rewritten in the predetermined direction.

By detecting the current change at this moment, binary information recorded in the record layer 52 of the target magnetoresistance effect element can be read. That is, if the magnetization direction of the magnetic recording layer 52 before rewriting is same as the magnetization direction thereof after rewriting, the current detected with the sense amplifier SA does not change.

However, in the case where the magnetization direction of the magnetic record layer 52 changes before and after rewriting, the current detected with the sense amplifier SA changes due to a magnetoresistance effect. Thus, the stored data (which corresponds to the magnetization direction of the record layer 52) can be read out. However, this method corresponds to the so-called "destructive readout" by which stored data is changed in the case of read-out.

On the other hand, when the magnetoresistance effect element has a layered structure of (magnetization free layer)/(insulated layer or non-magnetic layer)/(magnetic record layer), the so-called "nondestructive readout" is possible. That is, when using the magnetoresistance effect element of this structure, the magnetization direction is recorded in a magnetic record layer, and reading is performed by changing the magnetization direction of a magnetization free layer suitably, and by comparing the sense currents.

In this case, it is necessary to design so that the magnetization reversal magnetic field of a magnetization free layer may become smaller than the magnetization reversal magnetic field of the magnetic record layer.

Next, a magnetic probe and a magnetic head using a switching element of the embodiment of the invention are explained.

Figure 30:
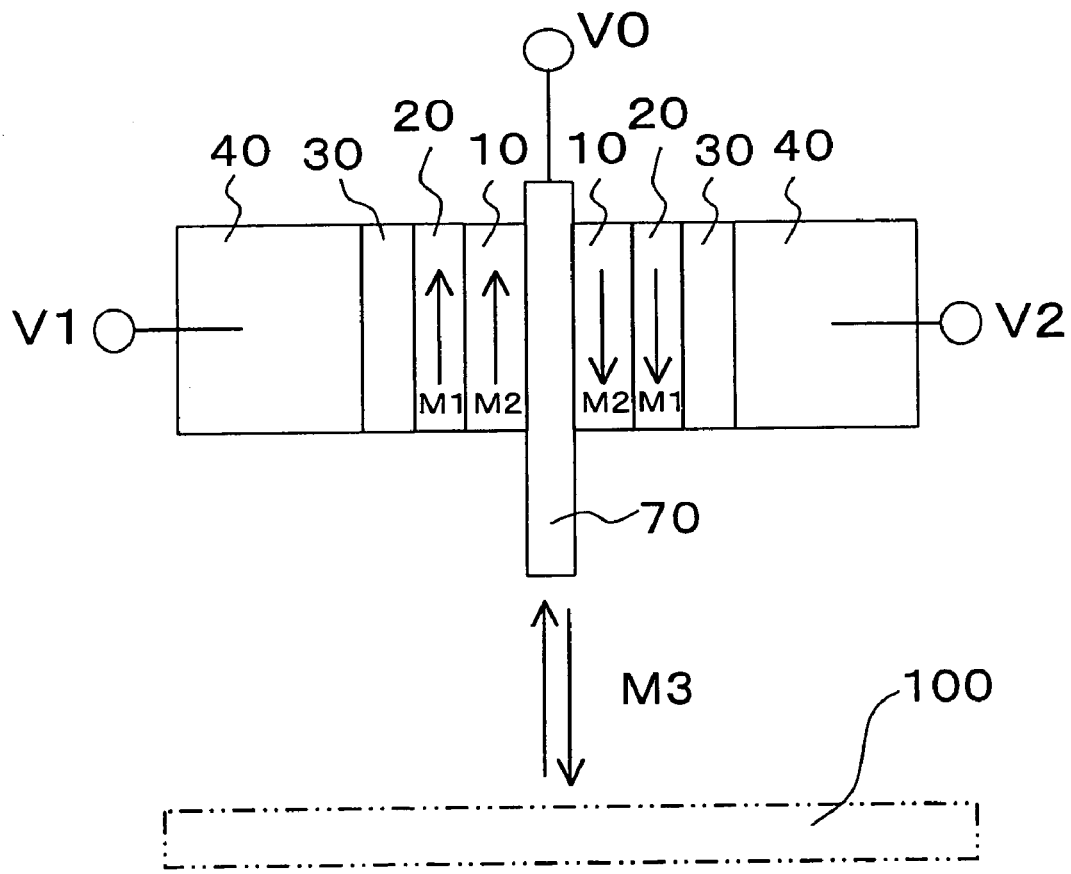
FIG. 30 is a conceptual diagram showing a basic structure of a magnetic probe and a magnetic head according to an embodiment of the invention.
Figure 31:
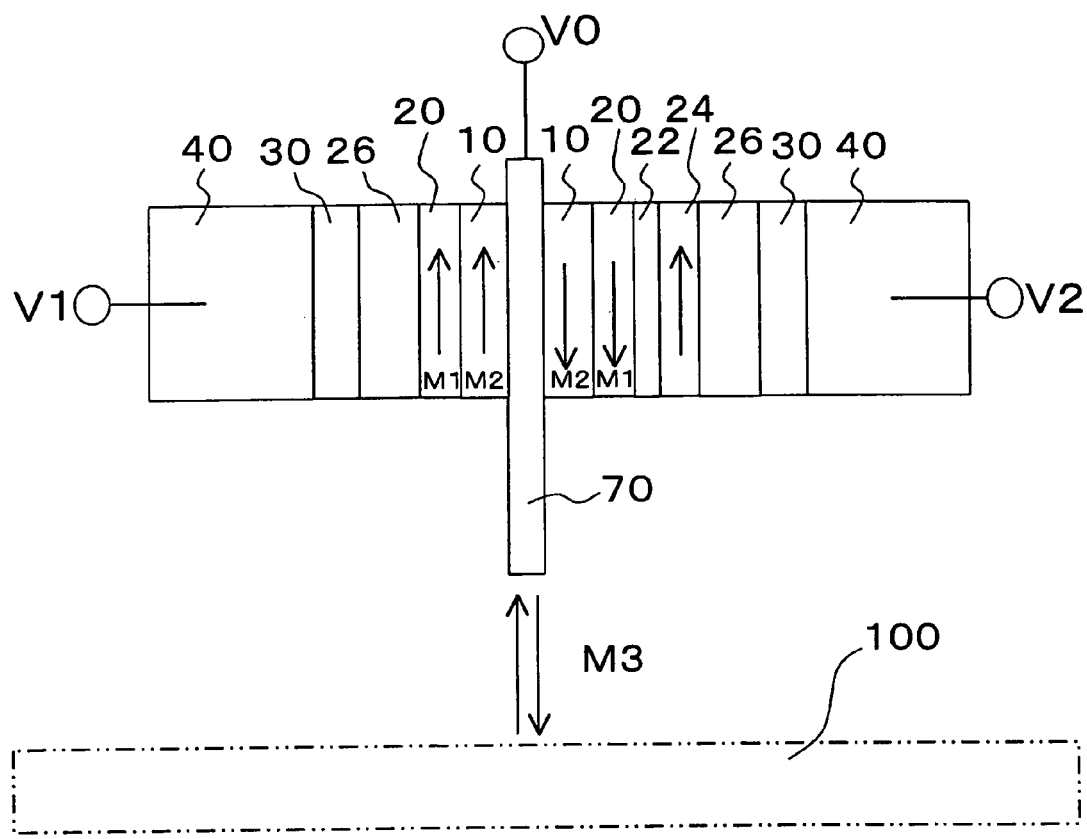
FIG. 31 is a conceptual diagram which shows a basic structure of a magnetic probe and a magnetic head using a switching element including an anti-ferromagnetic layer according to an embodiment of the invention.

FIG. 30 is a conceptual diagram showing the magnetic probe and a magnetic head according to an embodiment of the invention. In the figure, the same or equivalent components as those already explained with reference to FIGS. 1A through 29 are labeled with common reference numerals, and their detailed explanation is omitted.

In the magnetic probe of this embodiment, a pair of switching elements are provided in the both sides of a magnetic pole 70.

In the case of the example shown in this figure, these switching elements corresponds to those shown in FIGS. 1A and 1B. And in these switching elements, the magnetization M1 of the ferromagnetic layers 20 are fixed in the opposite direction each other. Therefore, when voltage is applied to the magnetic semiconductor layer 10 and ferromagnetism is induced, the direction of the magnetization M2 formed in each magnetic semiconductor layers 10 also turn into the opposite direction corresponding to the magnetization M1. Magnetization is formed in a magnetic pole 70 by this magnetization M2, and the stray magnetic field M3 is applied to the object 100 for an action.

As the magnetic probe, predetermined voltage is applied between V0–V1 or between V0–V2. Then, magnetization M2 is formed in one magnetic semiconductor layer 10 of a pair of the switching elements, and the magnetic field of a predetermined direction can be applied to the object 100 for an action from the magnetic pole 70.

If a magnetic recording medium is used as the object 100 for an action, for example, the magnetic probe can be used as a magnetic head for writing. Since current is not passed on the occasion of formation of a writing magnetic field in this case, power consumption can be greatly reduced, and it also becomes possible to make the capacity and the scale of a drive circuit much smaller. Furthermore, this magnetic probe can be applied to all the uses for applying a magnetic field, and the same effect is obtained.

EXAMPLES

Hereafter, some embodiments of the invention will be explained in more detail, referring to a specific example of the invention.

First Example

As the first example of the invention, one memory cell was fabricated on the basis of the memory array of the simple matrix structure shown in FIG. 18, the principle of the operation of the memory cell of the first type was confirmed.

It will be as the following if the structure of this magnetic memory is explained along with that manufacture procedure.

On the substrate which is not illustrated, a wiring layer with a thickness of 1 micrometer made of Cu was first produced by the damascene process as a lower layer bit line BL1. After that, an insulated layer was formed by CVD method, and then the surface was flattened by CMP (Chemical Mechanical Polishing).

Then, the stacking structure of TMR which has a ferromagnetic single tunnel junction structure was formed by a sputtering method. The material and the thickness of each layer were taken as Ta (10 nm)/Ru (3 nm)/Ir—Mn (8 nm)/CoFe (3 nm)/Ru (1 nm)/CoFe (3 nm)/AlOx (1 nm)/CoFeNi (2 nm)/Ru (5 nm) from the bottom in this order.

Next, the isolated pattern of a TMR element was produced by etching the stacking structure down to lower Ta ground layer by RIE (Reactive Ion Etching) using etching gas, while utilizing the top W layer as a hard mask. Then, SiOx was deposited by the low-temperature TEOS (tetra ethyl ortho silicate) method as an insulator, and the surface was flattened by CMP while leaving 1.5 nm of Ru layer.

Then, a ferromagnetic record layer CoFeNi(2 nm)/Ru(15 nm)/Ta (3 nm) were formed and pattered into a predetermined shape. At this moment, a magnetic record layer consists of CoFeNi (2 nm) (having a smaller area)/Ru (1.5 nm)/CoFeNi (2 nm) (having a larger area), and a ferromagnetic interaction is operating through the Ru layer.

Then, the low-temperature TEOS process was performed to form SiO2 on the patterned CoFeNi/Ru/Ta structure. Then, $SiO_2$ was removed by RIE down to Ta in the left-hand side of the structure shown in FIG. 18. After that, the stacking structure of magnetic semiconductor (GaMn)N (20 nm)/CoFe (3 nm)/IrMn (8 nm)/Ta (3 nm)/$SiO_2$ (300 nm)/Ru (10 nm) was formed in this order from the bottom using sputtering method and low temperature MBE (Molecular Beam Epitaxy).

Next, the switching element on the left-hand side of the structure shown in FIG. 18 was formed with the same procedure using Ru as a hard mask. Furthermore, a stacking structure of magnetic semiconductor (GaMn)N (20 nm)/CoFe (3 nm)/Ru (1 nm)/CoFe (3 nm)/IrMn (8 nm)/Ta (3 nm)/$SiO_2$ (300 nm)/Ru (10 nm) which corresponds to a right-hand side switching element was formed by the same procedure.

After having covered by $SiO_2$, and performing flattening by CMP, via holes were formed, and the gate electrode and the bit line BL2 were formed. Then, the sample was introduced into the heat treatment furnace which can apply a magnetic field, and a uniaxial anisotropy was introduced into the magnetic record layer of a TMR element, and unidirectional anisotropy was introduced into the magnetic pinned layer of a TMR element and a switching element, respectively.

Thus, in the magnetic memory of this example, a voltage was applied to the gate electrode 40 and the signal output of a TMR element was measured in order to check the principle of the operation of the switching element.

As a result, when a voltage was applied to two switching elements by turns, 37% change of the MR ratio was confirmed, and thus the effect of the magnetization memory of the invention has been proved.

Second Example

Next, as the second example of the invention, one memory cell was fabricated on the basis of the memory array of the simple matrix structure shown in FIG. 20, the principle of the operation of the memory cell of the second type was confirmed.

It will be as the following if the structure of this magnetic memory is explained along with that manufacture procedure.

On the substrate which is not illustrated, a wiring layer with a thickness of 1 micrometer made of Cu was first produced by the damascene process as a lower layer bit line BL1. After that, an insulated layer was formed by CVD method, and then the surface was flattened by CMP (Chemical Mechanical Polishing).

Then, the stacking structure of TMR which has a ferromagnetic single tunnel junction structure was formed by a sputtering method. The material and the thickness of each layer were taken as Ta (2 nm)/Ru (3 nm)/Pt—Mn (12 nm)/CoFe (2.5 nm)/Ru (1 nm)/CoFe (3 nm)/AlOx (1 nm)/CoFeNi (1.8 nm)/Ru (1.5 nm)/CoFeNe (1.8 nm)/Ta (9 nm)/Ru (30 nm) from the bottom in this order.

Next, the isolated pattern of a TMR element was produced by etching the stacking structure down to the lower Ru/Ta/Cu wiring layer BL1 by RIE (Reactive Ion Etching) using etching gas, while utilizing the top Ru layer as a hard mask.

Then, the low-temperature TEOS process was performed to form SiO2 on the patterned CoFeNi/Ru/Ta structure. Then, $SiO_2$ was removed by RIE down to Ta in the left-hand side of the structure shown in FIG. 20. After that, the stacking structure of magnetic semiconductor CoFe (5 nm)/(GaMn)N (20 nm)/CoFe (3 nm)/IrMn (8 nm)/Ta (3 nm)/$SiO_2$ (300 nm)/Ru (10 nm) was formed in this order from the bottom by using sputtering method and low temperature MBE (Molecular Beam Epitaxy).

Next, the switching element on the left-hand side of the structure shown in FIG. 20 was formed with the same procedure using the Ru layer as a hard mask. Furthermore, a stacking structure of magnetic semiconductor CoFe (5 nm)/(GaMn)N (20 nm)/CoFe (3 nm)/Ru (1 nm)/CoFe (3 nm)/IrMn (8 nm)/Ta (3 nm)/$SiO_2$ (300 nm)/Ru (10 nm) which corresponds to a right-hand side switching element was formed by the same procedure.

After having covered by SiO$_2$, and performing flattening by CMP, via holes were formed, and the gate electrode and the bit line BL2 were formed. Then, the sample was introduced into the heat treatment furnace which can apply a magnetic field, and a uniaxial anisotropy was introduced into the magnetic record layer of a TMR element, and unidirectional anisotropy was introduced into the magnetic pinned layer of a TMR element and a switching element, respectively.

Thus, in the magnetic memory of this example, a voltage was applied to the gate electrode 40 and the signal output of a TMR element was measured in order to check the principle of the operation of the switching element.

As a result, when a voltage was applied to two switching elements by turns, 42% change of the MR ratio was confirmed, and thus the effect of the magnetization memory of the invention has been proved.

Heretofore, some embodiments of the invention have been explained with reference to specific examples. The invention, however, is not limited to these specific examples. For example, the invention contemplates in its own cope all alternatives concerning materials, thicknesses, shapes, sizes, etc. of the magnetic semiconductor layer, ferromagnetic layer, insulating film, anti-ferromagnetic layer, nonmagnetic metal layer, electrode that are components of the switching elements and/or magnetoresistance effect element as far as persons skilled in the art can appropriately select them and can practically use the invention to obtain substantially the same effects.

Similarly, the invention contemplates in its own scope all alternatives concerning structures, materials, shapes and sizes of the bit line, digit line, word line, overcoat layer, selection transistor, diode and other composing the magnetic memory according to any embodiment of the invention as far as persons skilled in the art can appropriately select them and can practically use the invention to obtain substantially the same effects.

Further, the invention contemplates in its scope all magnetic heads including a lateral recording head and a vertical recording head that persons skilled in the art can make by modifying the magnetic memories shown here as embodiments of the invention.

Furthermore, the invention contemplates in its scope all magnetic memories that persons skilled in the art can make by modifying the magnetic memories shown here as embodiments of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetic memory comprising:
a magnetic switching element including:
a magnetic semiconductor layer which changes its state from a paramagnetic state to a ferromagnetic state by applying a voltage thereto; and
a ferromagnetic layer provided near the magnetic semiconductor layer and having a magnetization substantially pinned in a first direction; and
a record layer made of a ferromagnetic material provided apart from the magnetic semiconductor layer,
a magnetization corresponding to the magnetization of the ferromagnetic layer being induced in the magnetic semiconductor layer by applying a voltage to the magnetic semiconductor layer, and a magnetization of the record layer being controlled by applying a magnetic field formed by the magnetization induced in the magnetic semiconductor layer,
further comprising a magnetic layer for bias application made of a ferromagnetic material stacked to adjoin the magnetic semiconductor layer,
the magnetic field being applied to the record layer through the magnetic layer for bias application.

2. The magnetic memory according to claim 1, wherein the magnetic layer for bias application and the record layer are provided on substantially a common plane, and side surfaces thereof are apart from each other.

3. A magnetic memory comprising:
a magnetic switching element including:
a magnetic semiconductor layer which changes its state from a paramagnetic state to a ferromagnetic state by applying a voltage thereto; and
a ferromagnetic layer provided near the magnetic semiconductor layer and having a magnetization substantially pinned in a first direction; and
a record layer made of a ferromagnetic material provided apart from the magnetic semiconductor layer,
a magnetization corresponding to the magnetization of the ferromagnetic layer being induced in the magnetic semiconductor layer by applying a voltage to the magnetic semiconductor layer, and a magnetization of the record layer being controlled by applying a magnetic field formed by the magnetization induced in the magnetic semiconductor layer,
further comprising a layered structure provided to adjoin the ferromagnetic layer, the layered structure including a nonmagnetic layer, a ferromagnetic film and an anti-ferromagnetic layer stacked in this order, and a direction of the magnetization of the ferromagnetic layer and a direction of a magnetization of the ferromagnetic film being substantially opposite.

4. A magnetic memory comprising:
a magnetic switching element including:
a gate electrode;
a magnetic semiconductor layer which changes its state from a paramagnetic state to a ferromagnetic state by applying a voltage thereto;
a gate insulating film provided between the gate electrode and the magnetic semiconductor layer; and
a ferromagnetic layer provided between the gate insulating film and the magnetic semiconductor layer or provided on a opposite side of the magnetic semiconductor layer from the gate insulating film, the ferromagnetic layer having a magnetization substantially pinned in a first direction; and
a record layer made of a ferromagnetic material provided apart from the magnetic semiconductor layer,
a magnetization corresponding to the magnetization of the ferromagnetic layer being induced in the magnetic semiconductor layer by applying a voltage from the gate electrode to the magnetic semiconductor layer through the gate insulating film, and a magnetization of the record layer being controlled by applying a magnetic field formed by the magnetization induced in the magnetic semiconductor layer,
further comprising a magnetic layer for bias application made of a ferromagnetic material stacked to adjoin the magnetic semiconductor layer, the magnetic field being applied to the record layer through the magnetic layer for bias application.

5. The magnetic memory according to claim 4, wherein the magnetic layer for bias application and the record layer are provided on substantially a common plane, and side surfaces thereof are apart from each other.

6. A magnetic memory comprising:
a magnetic switching element including:
  a gate electrode;
  a magnetic semiconductor layer which changes its state from a paramagnetic state to a ferromagnetic state by applying a voltage thereto;
  a gate insulating film provided between the gate electrode and the magnetic semiconductor layer; and
  a ferromagnetic layer provided between the gate insulating film and the magnetic semiconductor layer or provided on a opposite side of the magnetic semiconductor layer from the gate insulating film, the ferromagnetic layer having a magnetization substantially pinned in a first direction; and
a record layer made of a ferromagnetic material provided apart from the magnetic semiconductor layer,
a magnetization corresponding to the magnetization of the ferromagnetic layer being induced in the magnetic semiconductor layer by applying a voltage from the gate electrode to the magnetic semiconductor layer through the gate insulating film, and a magnetization of the record layer being controlled by applying a magnetic field formed by the magnetization induced in the magnetic semiconductor layer,
further comprising a layered structure provided to adjoin the ferromagnetic layer, the layered structure including a nonmagnetic layer, a ferromagnetic film and an anti-ferromagnetic layer stacked in this order, and a direction of the magnetization of the ferromagnetic layer and a direction of a magnetization of the ferromagnetic film being substantially opposite.

7. A magnetic switching element comprising:
a gate electrode;
a magnetic semiconductor layer which changes its state from a paramagnetic state to a ferromagnetic state by applying a voltage thereto; and
a ferromagnetic layer provided between the gate electrode and the magnetic semiconductor layer, the ferromagnetic layer being electrically insulating and being substantially pinned in magnetization in one direction,
a magnetization corresponding to the magnetization of the ferromagnetic layer being induced in the magnetic semiconductor layer by applying a voltage to the magnetic semiconductor layer from the gate electrode through the ferromagnetic layer,
further comprising a layered structure provided to adjoin the ferromagnetic layer, the layered structure including a nonmagnetic layer, a ferromagnetic film and an anti-ferromagnetic layer stacked in this order, and a direction of the magnetization of the ferromagnetic layer and a direction of a magnetization of the ferromagnetic film being substantially opposite.

* * * * *